US012753499B2

(12) United States Patent
Holbrook

(10) Patent No.: US 12,753,499 B2
(45) Date of Patent: Oct. 6, 2026

(54) FLOW CONTROL ARRANGEMENTS, SEMICONDUCTOR PROCESSING SYSTEMS HAVING FLOW CONTROL ARRANGEMENTS, AND FLOW CONTROL METHODS

(71) Applicant: ASM IP Holding, B.V., Almere (NL)

(72) Inventor: Glenn Holbrook, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 520 days.

(21) Appl. No.: 18/458,216

(22) Filed: Aug. 30, 2023

(65) Prior Publication Data

US 2024/0068098 A1 Feb. 29, 2024

Related U.S. Application Data

(60) Provisional application No. 63/374,169, filed on Aug. 31, 2022.

(51) Int. Cl.
*C23C 16/455* (2006.01)
*C23C 16/44* (2006.01)
(Continued)

(52) U.S. Cl.
CPC .... *C23C 16/45561* (2013.01); *C23C 16/4408* (2013.01); *C23C 16/45589* (2013.01); *G05D 7/0635* (2013.01); *H01J 37/32449* (2013.01); *H01J 37/32871* (2013.01); *C23C 16/4412* (2013.01); *C23C 16/4481* (2013.01); *H10P 72/0402* (2026.01)

(58) Field of Classification Search
CPC ............ C23C 16/4408; C23C 16/4412; C23C 16/4481; C23C 16/45561; C23C 16/45587; C23C 16/45589; C23C 16/45591; H01J 37/3244; H01J 37/32449; H01J 37/32834; H01J 37/32844; H01J 37/32853; G05D 7/0635; H10P 72/0604
See application file for complete search history.

(56) References Cited

U.S. PATENT DOCUMENTS 3,643,912 A 2/1972 Livingston
4,355,654 A 10/1982 Levesque
(Continued)

OTHER PUBLICATIONS

Ngai et al., Silane Safety/Lessons Learned and Accident Prevention, Silane Safety IEEE Conference 2008.

*Primary Examiner* — Kurt Sweely
(74) *Attorney, Agent, or Firm* — Banner & Witcoff, Ltd.

(57) ABSTRACT

A flow control arrangement includes a source conduit, a supply conduit, a shutoff valve, and a slow-close actuator. The shutoff valve connects the source conduit to the supply conduit. The slow-close actuator is connected to the shutoff valve to close the shutoff valve during a slow-close interval, the pyrophoric material detector is operably connected to the slow-close actuator to close the shutoff valve upon detection of a metastable mass of a pyrophoric material outside of the flow control arrangement, and the slow-close interval is sized to limit shock communicated to the metastable mass by closing of the shutoff valve and prevent rapid deflagration or detonation of the metastable mass of the pyrophoric material. Semiconductor processing systems including the flow control arrangement and related flow control methods are also described.

19 Claims, 14 Drawing Sheets

(51) Int. Cl.

| | |
|---|---|
| ***C23C 16/448*** | (2006.01) |
| ***G05D 7/06*** | (2006.01) |
| ***H01J 37/32*** | (2006.01) |
| ***H10P 72/00*** | (2026.01) |

(56) References Cited

U.S. PATENT DOCUMENTS

| | | | | |
|---|---|---|---|---|
| 4,415,210 | A | 11/1983 | Belart | |
| 4,872,638 | A | 10/1989 | Thompson | |
| 4,995,355 | A | 2/1991 | Cowley | |
| 5,137,187 | A | 8/1992 | Nichols | |
| 10,647,546 | B2 | 5/2020 | Shepherd | |
| 12,554,273 | B2 * | 2/2026 | Holbrook | G05D 7/0635 |
| 2003/0001000 | A1 | 1/2003 | Shabtay | |
| 2006/0115591 | A1 * | 6/2006 | Olander | C23C 14/48 257/E21.334 |
| 2008/0032502 | A1 * | 2/2008 | Baskin | C23C 16/4401 438/680 |
| 2010/0263742 | A1 | 10/2010 | Bogdanska | |
| 2011/0214742 | A1 * | 9/2011 | Izutani | G05D 7/0647 137/1 |
| 2012/0222751 | A1 * | 9/2012 | Okabe | H10P 72/0604 137/376 |
| 2019/0301638 | A1 | 10/2019 | Lawrence | |
| 2021/0123597 | A1 | 4/2021 | Pablo Curto | |
| 2024/0018656 | A1 * | 1/2024 | Holbrook | C23C 16/4412 |
| 2024/0019880 | A1 * | 1/2024 | Holbrook | G05D 7/0647 |

* cited by examiner

FLOW CONTROL ARRANGEMENTS, SEMICONDUCTOR PROCESSING SYSTEMS HAVING FLOW CONTROL ARRANGEMENTS, AND FLOW CONTROL METHODS

CROSS-REFERENCE TO RELATED APPLICATION(S)

This application claims the benefit of U.S. Provisional Application 63/374,169 filed on Aug. 31, 2022, the entire contents of which are incorporated herein by reference.

FIELD OF INVENTION

The present disclosure generally relates to controlling the flow of fluids in fluid systems. More particularly, the present disclosure relates to controlling fluid flows containing pyrophoric materials, such as in fluid flows containing pyrophoric materials provided to semiconductor processing systems during the fabrication of semiconductor devices.

BACKGROUND OF THE DISCLOSURE

Flow systems, such as fluid system employed in semiconductor processing systems during the fabrication of semiconductor devices, commonly convey fluids containing pyrophoric materials from bulks sources to usage locations. For example, fluid systems may communicate fluids containing pyrophoric liquid-state metalorganics of main group metals, such as indium and gallium, which enables the main group metal to be employed at the fluid destination. Fluid systems may communicate fluids containing gaseous-state materials with pyrophoric properties, such as nonmetal hydrides for use at the fluid destination. Examples pyrophoric non-metal hydrides include arsine, phosphine, diborane, and silane, which may be used by semiconductor processing systems employed to deposit material layers onto substrates during the fabrication of semiconductor devices.

Because pyrophoric materials may react upon contact with oxygen and/or moisture resident in air, flow control arrangements employed to communicate such fluids typically include features intended to reduce (or eliminate) risk leakage from the fluid-conveying structures. For example, double-walled conduit may be employed to contain pyrophoric material within an external annular space in the unlikely event that the interior wall of the conduit develops a leak by impounding escaped pyrophoric material. Fluid-conveying structures such as metering valves may be positioned in a gas cabinet or gas box and the gas cabinet or gas box ventilated to remove pyrophoric fluid in the event of leakage from a fluid-conveying structure housed within the gas cabinet or gas box. And emergency shutoff valves actuated by fire/flame sensors may be employed to rapidly shutoff flow of pyrophoric material through the fluid system in the event that fire. Flame, or smoke is detected outside of the fluid system.

In some fluid systems, pyrophoric material escaping the fluid system may not immediately react with oxygen and/or moisture within the ambient environment. For reasons that are poorly understood, the pyrophoric material may instead aggregate into a metastable mass of pyrophoric material lingering outside of the fluid system. Such lingering metastable masses of pyrophoric materials rapidly deflagrate or detonate if disturbed, for example, in the event that the metastable mass is mechanically or fluidly shocked. For example, a pressure wave communicated by pyrophoric material traversing a shutoff valve due to rapid closing of the shutoff valve (e.g., due to detection of fire/flame or due to detection of leakage from the fluid system itself) may provide shock sufficient to trigger deflagration or detonation of a metastable mass fluidly coupled to the pyrophoric fluid through a leakage path in the fluid system, potentially leading to injury and/or equipment damage.

Such systems and methods have generally been considered suitable for their intended purpose. However, there remains a need in the art for improved flow control arrangements, semiconductor processing systems including flow control arrangement, and methods of controlling fluid flows using flow control arrangements. The present disclosure provides a solution to this need.

SUMMARY OF THE DISCLOSURE

A flow control arrangement is provided. The flow control arrangement includes a source conduit, a supply conduit, a shutoff valve, a slow-close actuator, and a pyrophoric material detector. The shutoff valve connects the source conduit to the supply conduit. The slow-close actuator is connected to the shutoff valve and is configured to close the shutoff valve during a slow-close interval. The pyrophoric material detector is operably connected to the slow-close actuator and is configured to close the shutoff valve upon detection of a metastable mass of a pyrophoric material disposed outside of the flow control arrangement. The slow-close interval is sized to limit a shock communicated to the metastable mass by closing of the shutoff valve to prevent deflagration or detonation of the metastable mass.

In addition to one or more of the features described above, or as an alternative, further examples may include a manual valve connected to the source conduit and fluidly coupled therethrough to the shutoff valve. A precursor source including the pyrophoric material may be connected to the source conduit and in selective fluid communication with the shutoff valve through the manual valve, wherein the pyrophoric material is a silicon-containing material.

In addition to one or more of the features described above, or as an alternative, further examples may include a metering valve connected to the supply conduit. A ventilated cabinet or gas box may enclose the metering valve. The pyrophoric material detector may be arranged within an interior of the ventilated cabinet or gas box, such as within a region of static or slow-flow within the ventilated cabinet or gas box.

In addition to one or more of the features described above, or as an alternative, further examples may include a process chamber connected to the supply conduit and in selective fluid communication with the source conduit through the shutoff valve. A substrate support may be arranged within the process chamber and configured to support a substrate during deposition of a material layer on the substrate with the pyrophoric material. An exhaust source may be connected the process chamber and fluidly coupled therethrough with the source conduit.

In addition to one or more of the features described above, or as an alternative, further examples may include that an effective flow area of the shutoff valve is progressively reduced during the slow-close interval. The slow-close interval may be between about 1 second and about 10 seconds, or between about 3 seconds and about 7 seconds, or between about 3 seconds and about 5 seconds. The slow-close interval may be about 4 seconds.

In addition to one or more of the features described above, or as an alternative, further examples may include that the slow-close actuator a closure and a solenoid. The closure may be supported within a valve body and movable between a first position and a second position, the valve body may fluidly couple the supply conduit to the source conduit in the first position, and the closure may fluidly separate the supply conduit from the source conduit in the second position. The solenoid may be operatively connected to the closure and configured to move the closure from the first position to the second position during the slow-close interval.

In addition to one or more of the features described above, or as an alternative, further examples may include a slow-close pneumatic chamber and a slow-close diaphragm member. The slow-close pneumatic chamber may be defined within a valve body of the shutoff valve. The slow-close diaphragm member may be disposed within the valve body and at least partially bound the slow-close pneumatic chamber. The slow-close diaphragm member has a first position and a second position, the valve body fluidly coupling the supply conduit to the source conduit in the first position, the slow-close diaphragm member fluidly separating the supply conduit from the source conduit in the second position.

In addition to one or more of the features described above, or as an alternative, further examples may include a slow-close pneumatic actuation conduit, an actuation valve, a pneumatic source, and slow-close restrictive flow orifice (RFO). The pneumatic actuation conduit is connected to the valve body. The actuation valve is connected to the pneumatic actuation conduit and is fluidly coupled therethrough to the slow-close pneumatic chamber. The pneumatic source is connected to the pneumatic actuation conduit and is in selective fluid communication with the slow-close pneumatic chamber through the actuation valve. The slow-close restrictive flow orifice is arranged along the pneumatic actuation conduit and is configured to throttle an actuation fluid provided into the slow-close pneumatic chamber to define the slow-close interval.

In addition to one or more of the features described above, or as an alternative, further examples may include an inert fluid conduit, an inert fluid supply valve, an inert fluid source, and a slow-open actuator. The inert fluid conduit may be connected to the supply conduit. The inert fluid supply valve may be connected to the inert fluid conduit and fluidly coupled therethrough to the supply conduit. The inert fluid source may be connected to the inert fluid conduit and in selective fluid communication with the supply conduit through the inert fluid supply valve. The slow-open actuator may be connected to the inert fluid supply valve to open the inert fluid supply valve during the slow-close interval. The pyrophoric material detector may be operably connected to the slow-open actuator.

In addition to one or more of the features described above, or as an alternative, further examples may include that the slow-open actuator may have a slow-open interval during which an effective flow area of the inert fluid supply valve is progressively increased. The slow-open interval may be between about 1 second and about 10 seconds, or between about 3 seconds and about 7 seconds, or between about 3 seconds and about 5 seconds, or about 4 seconds.

In addition to one or more of the features described above, or as an alternative, further examples may include that the slow-open interval of the slow-open actuator is substantially equivalent to the slow-close interval of the slow-close actuator.

In addition to one or more of the features described above, or as an alternative, further examples may include a valve member. The valve member may be supported within a valve body of the inert fluid supply valve and movable between a first position and a second position. The valve body may fluidly couple the inert fluid source to the supply conduit in the first position, the valve member may fluidly separate the inert fluid source from the supply conduit in the second position, and the slow-open actuator may include a solenoid operatively connected to the valve member and configured to move the valve member from the first position to the second position during a slow-open interval.

In addition to one or more of the features described above, or as an alternative, further examples may include a slow-open pneumatic actuation conduit, an actuation valve, a pneumatic source, and a slow-open RFO. The slow-open pneumatic actuation conduit may be connected to the inert fluid supply valve. The actuation valve may be connected to the slow-open pneumatic actuation conduit and fluidly coupled therethrough to the inert fluid supply valve. The pneumatic source may be fluidly coupled to the actuation valve and in selective fluid communication with the inert fluid supply valve through the actuation valve. The slow-open RFO may be arranged along the slow-open pneumatic actuation conduit and configured to throttle a slow-close actuation fluid to the inert fluid supply valve to define the slow-open interval.

In addition to one or more of the features described above, or as an alternative, further examples may include an actuation valve. The actuation valve may yoke the shutoff valve to the inert fluid supply valve. The actuation valve may be configured to coincidently close the shutoff valve and open inert fluid supply valve.

In addition to one or more of the features described above, or as an alternative, further examples may include a controller responsive to instructions recorded on a memory to receive an indication of the metastable mass of the pyrophoric material is disposed outside of the flow control arrangement from the pyrophoric material detector, close the shutoff valve using the slow-close actuator during a slow-close interval that is between about 1 second and about 10 seconds, wherein an effective flow area of the shutoff valve is progressively reduced during the slow-close interval, and limit a shock communicated to the metastable mass of the pyrophoric material disposed outside the flow control arrangement and fluidly coupled to a fluid including the pyrophoric material traversing the shutoff valve by movement of a closure within the shutoff valve between an open position and a closed position.

In addition to one or more of the features described above, or as an alternative, further examples may include that the instructions further cause the controller to introduce an inert fluid into the supply conduit coincident with closing of the shutoff valve.

A semiconductor processing system is provided. The semiconductor processing system includes a precursor source, a flow control arrangement as described above, and a process chamber. The precursor source is connected to the source conduit and is in selective fluid communication with the supply conduit through the shutoff valve. The process chamber includes a substrate support, is connected to the supply conduit, and is in selective fluid communication with the source conduit through the shutoff valve. A metering valve is connected to the supply conduit and fluidly couples the shutoff valve to the process chamber. A ventilated cabinet or gas box encloses the metering valve and the pyrophoric material detector.

A flow control method is provided. The method includes, at the flow control arrangement as described above, receiving an indication of the metastable mass from the pyrophoric material detector and closing the shutoff valve using the shutoff valve during a slow-close interval responsive to receipt of the indication of the metastable mass to limit a shock communicated to the metastable mass by the closing of the shutoff valve to prevent rapid deflagration or detonation of the metastable mass. The slow-close interval is between 1 second and 10 seconds during an effective flow area of the shutoff valve is progressively reduced.

In addition to one or more of the features described above, or as an alternative, further examples may include opening an inert fluid supply valve using a slow-open actuator during a slow-open interval of between about 1 second and about 10 seconds in concert with the closing of the shutoff valve. An effective flow area of the inert fluid supply valve may be progressively increased during the slow-open interval, and the closing of the shutoff valve limits shock to a metastable mass of the pyrophoric material and outside the flow control arrangement.

In addition to one or more of the features described above, or as an alternative, further examples may include energizing a solenoid or switching flow of actuation fluid from the slow-open actuator to the slow-close actuator.

This summary is provided to introduce a selection of concepts in a simplified form. These concepts are described in further detail in the detailed description of examples of the disclosure below. This summary is not intended to identify key features or essential features of the claimed subject matter, nor is it intended to be used to limit the scope of the claimed subject matter.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

Figure 1:
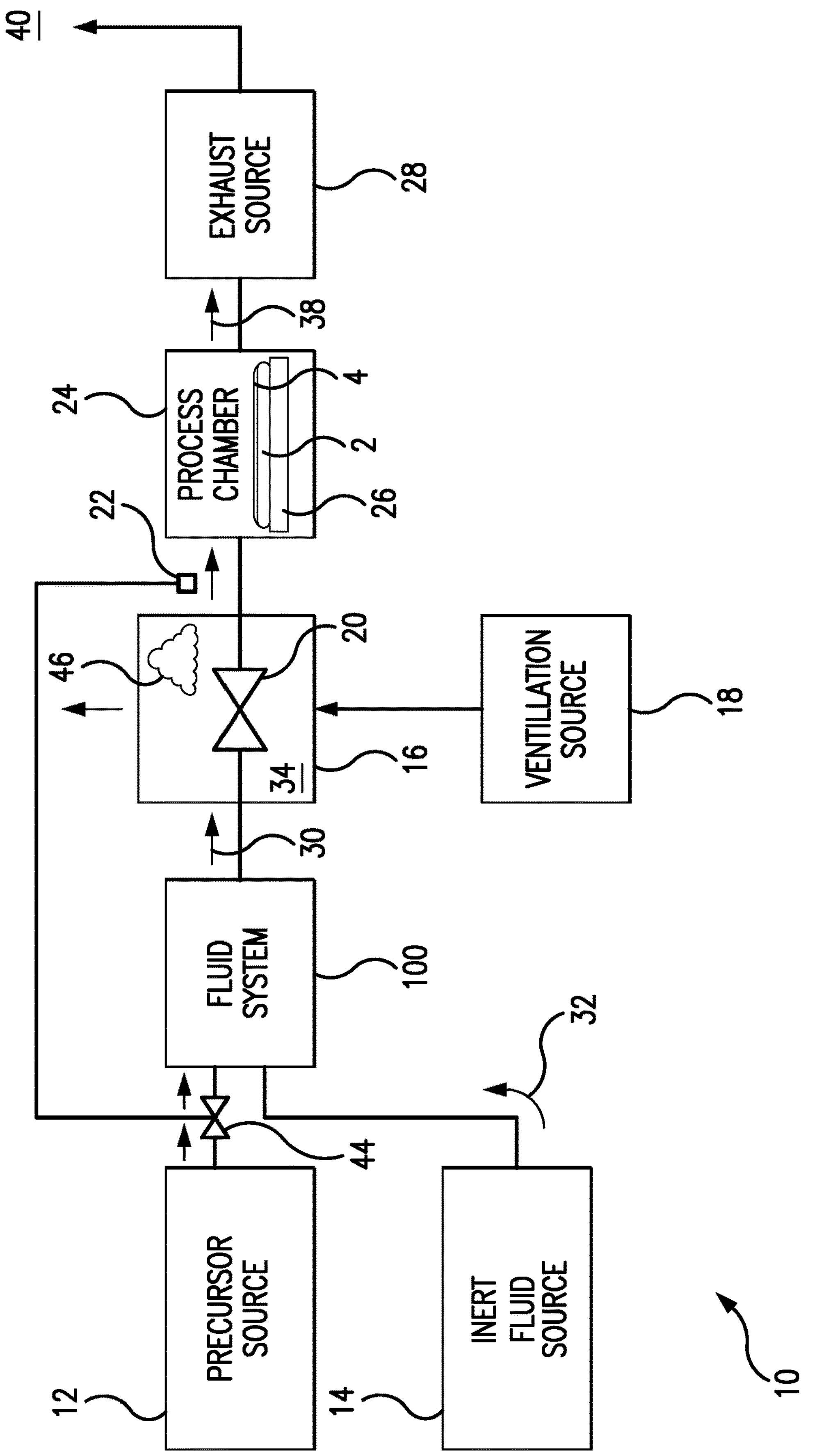
FIG. 1 is a schematic view of a semiconductor processing system including a flow control arrangement in accordance with the present disclosure, showing the flow control arrangement connecting a precursor source to a process chamber to provide a precursor flow containing a pyrophoric material during deposition of a material layer onto a substrate.
Figure 5:
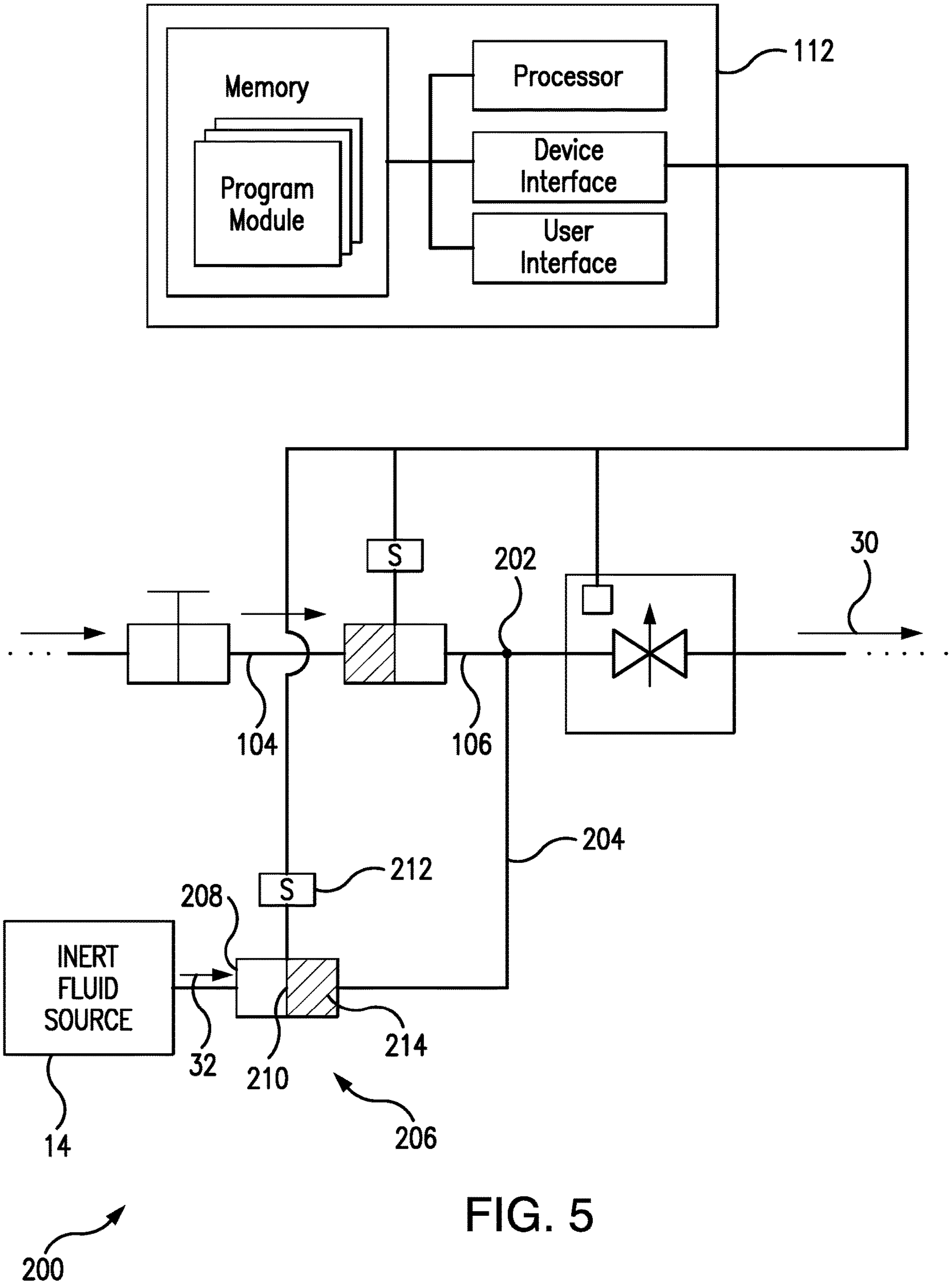
FIGS. 5 and 6 are schematic views of the flow control arrangement of FIG. 1 according to another example, showing a shutoff valve with a slow-close actuator and an inert fluid supply valve with a slow-open actuator yoked to one another to introduce an inert fluid into pyrophoric fluid traversing the shutoff valve during closing of the shutoff valve.
Figure 6:
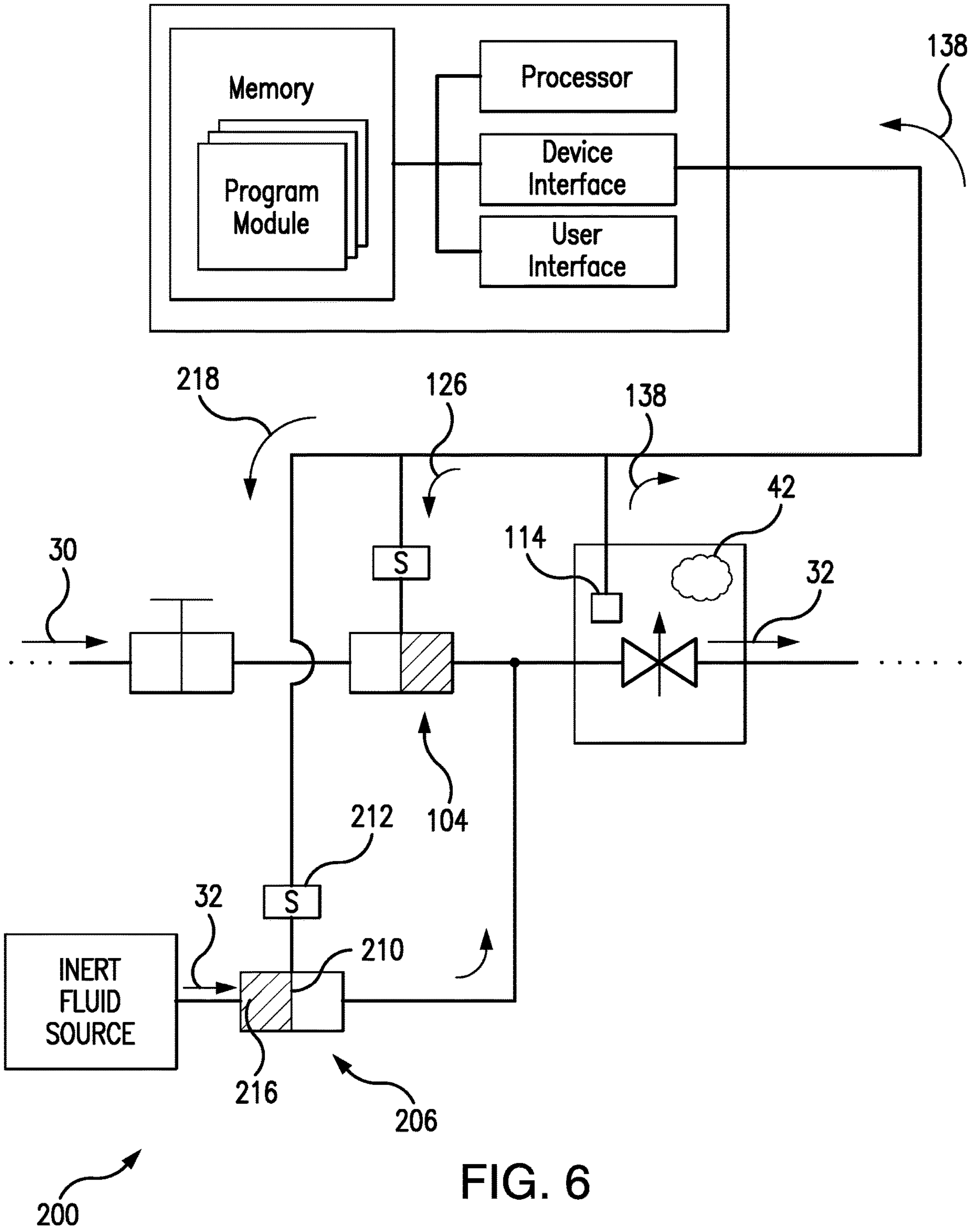
Figure 7:
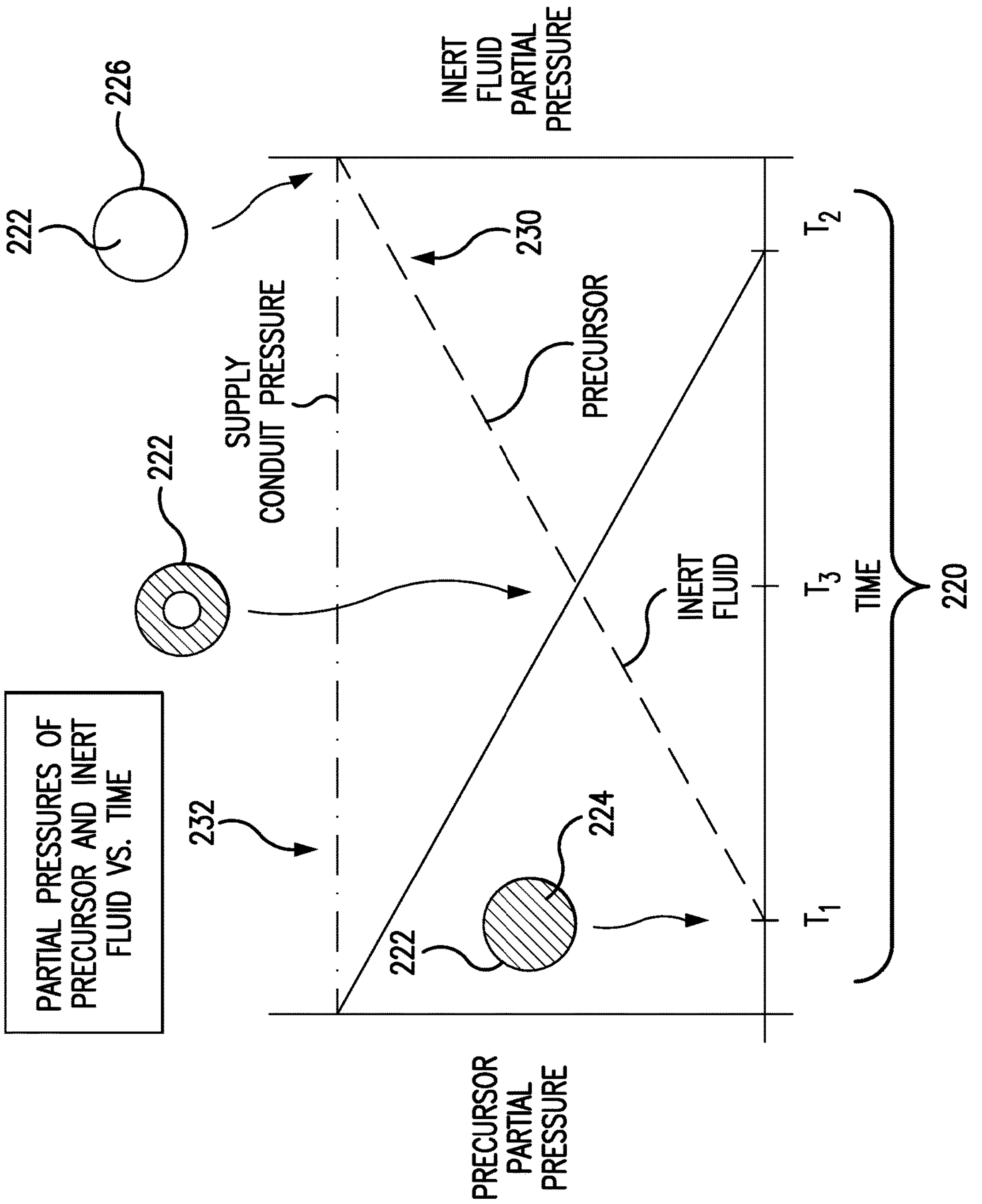
Figure 8:
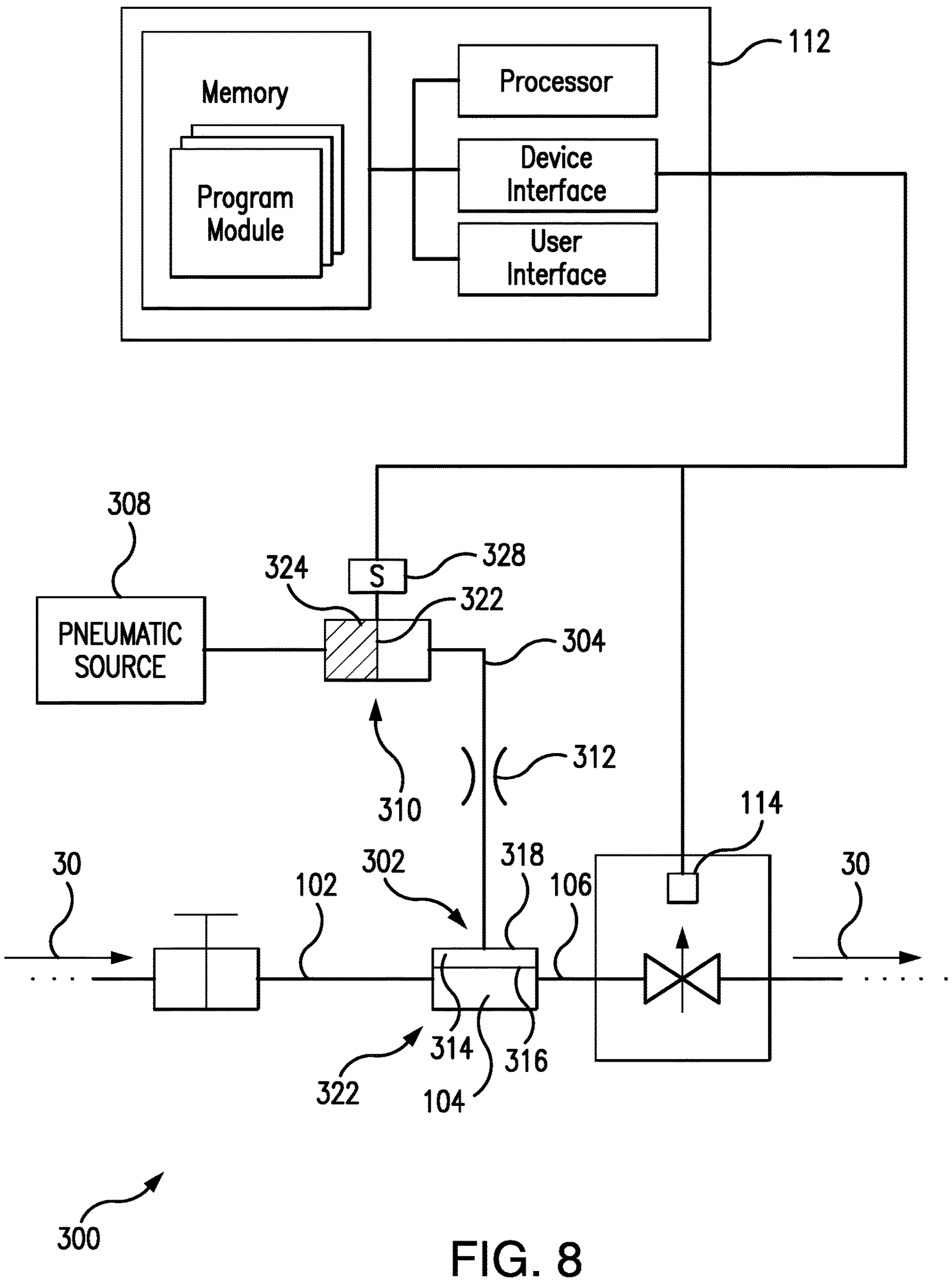
Figure 9:
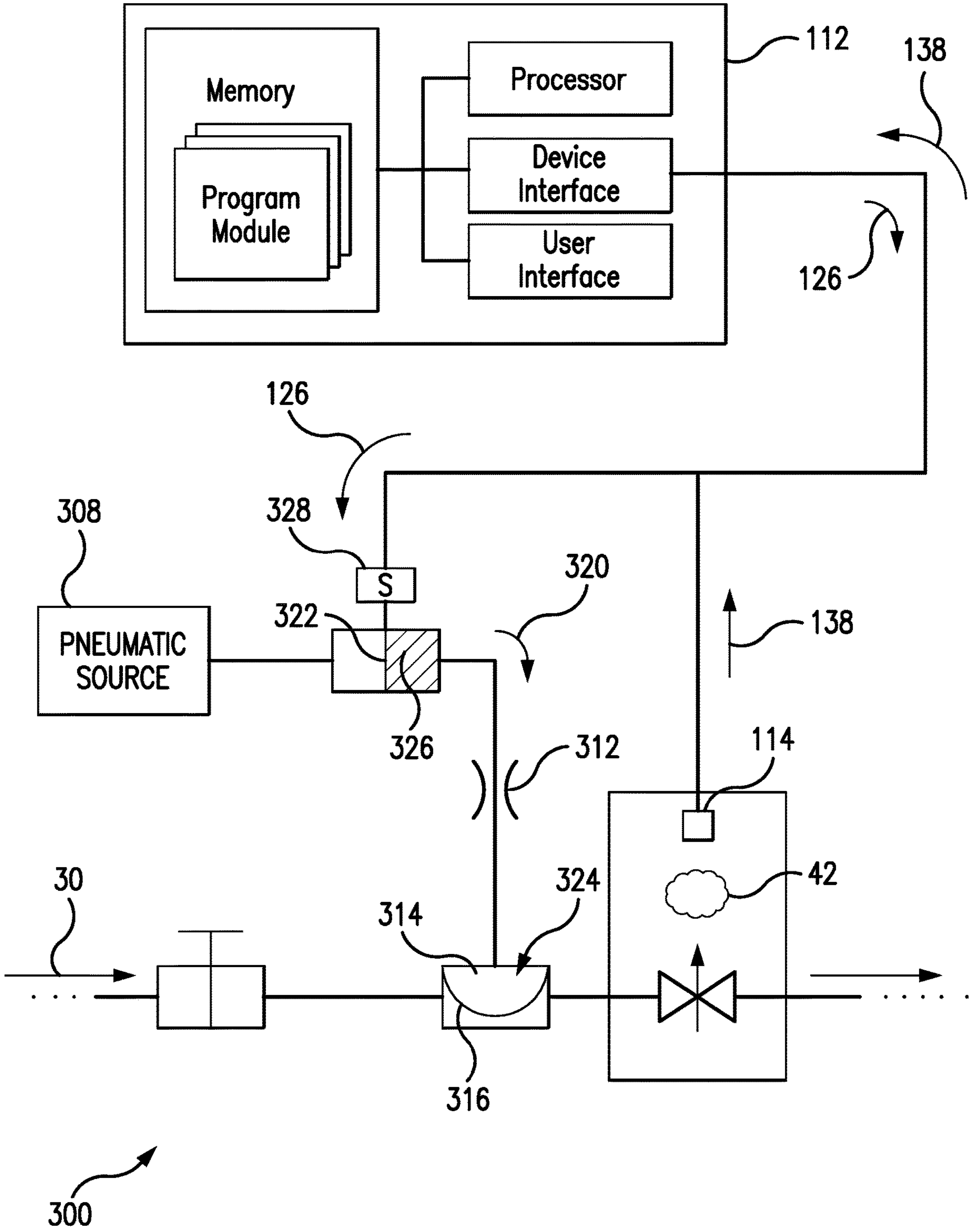
Figure 10:
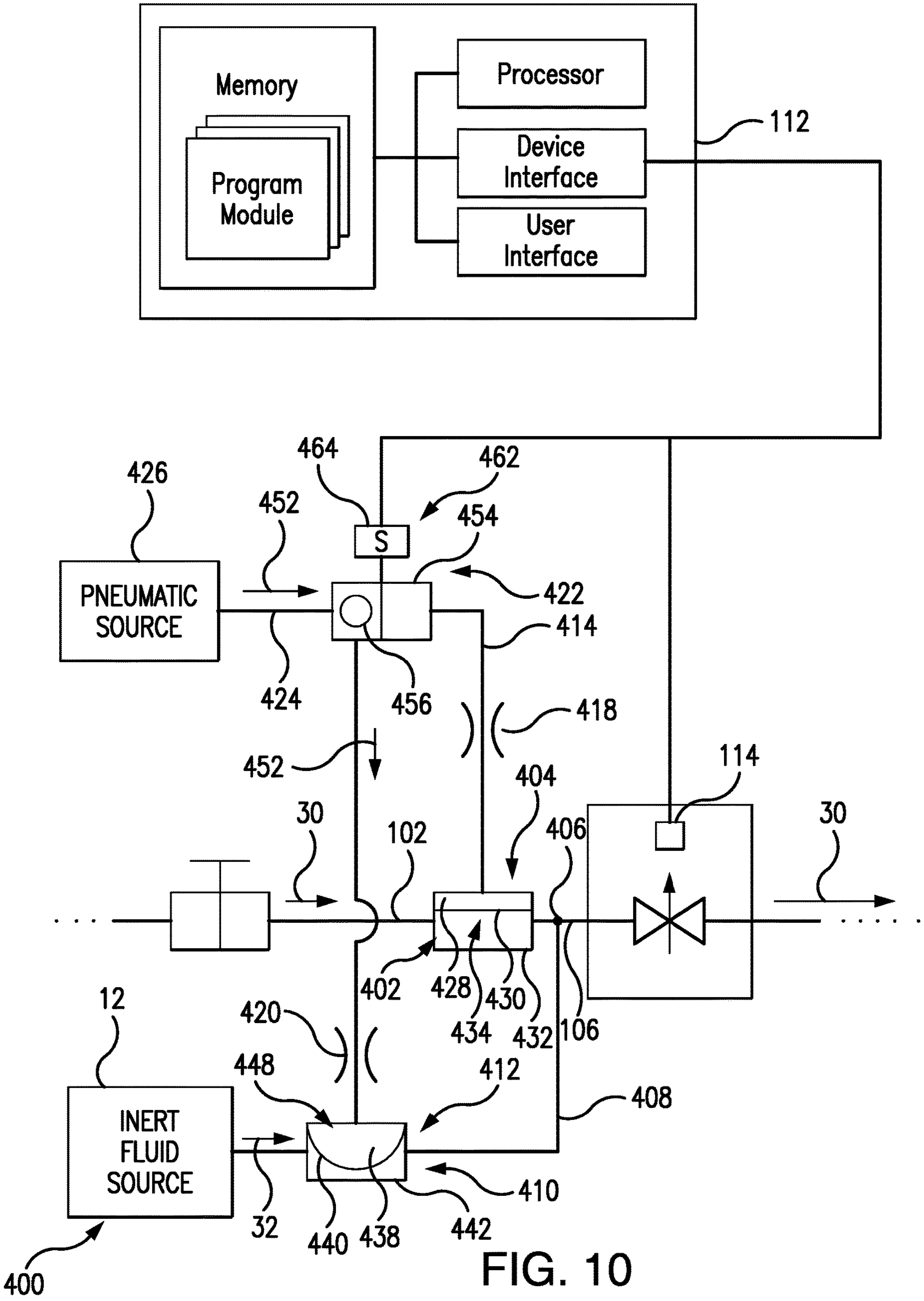
Figure 11:
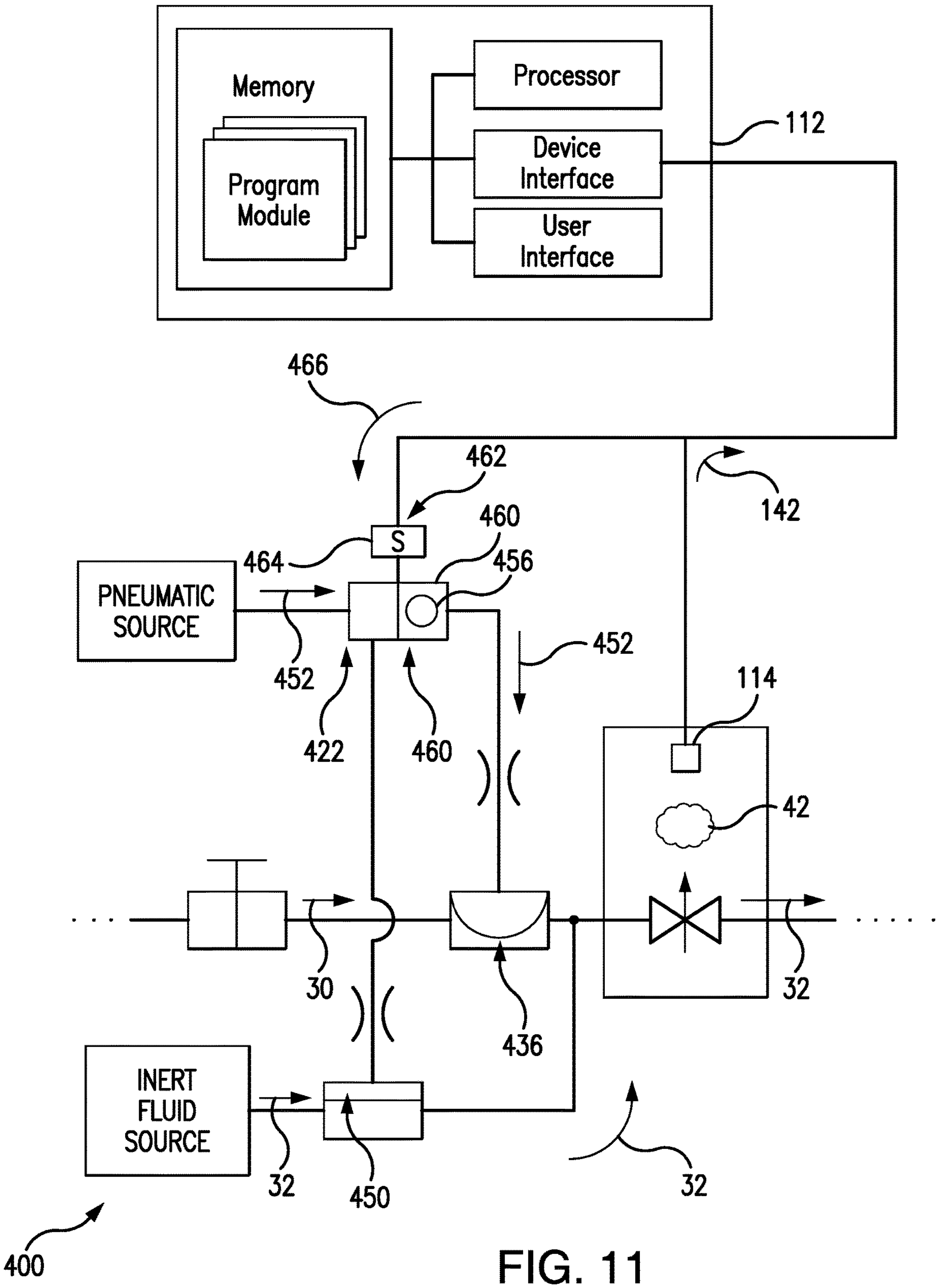
Figure 12:
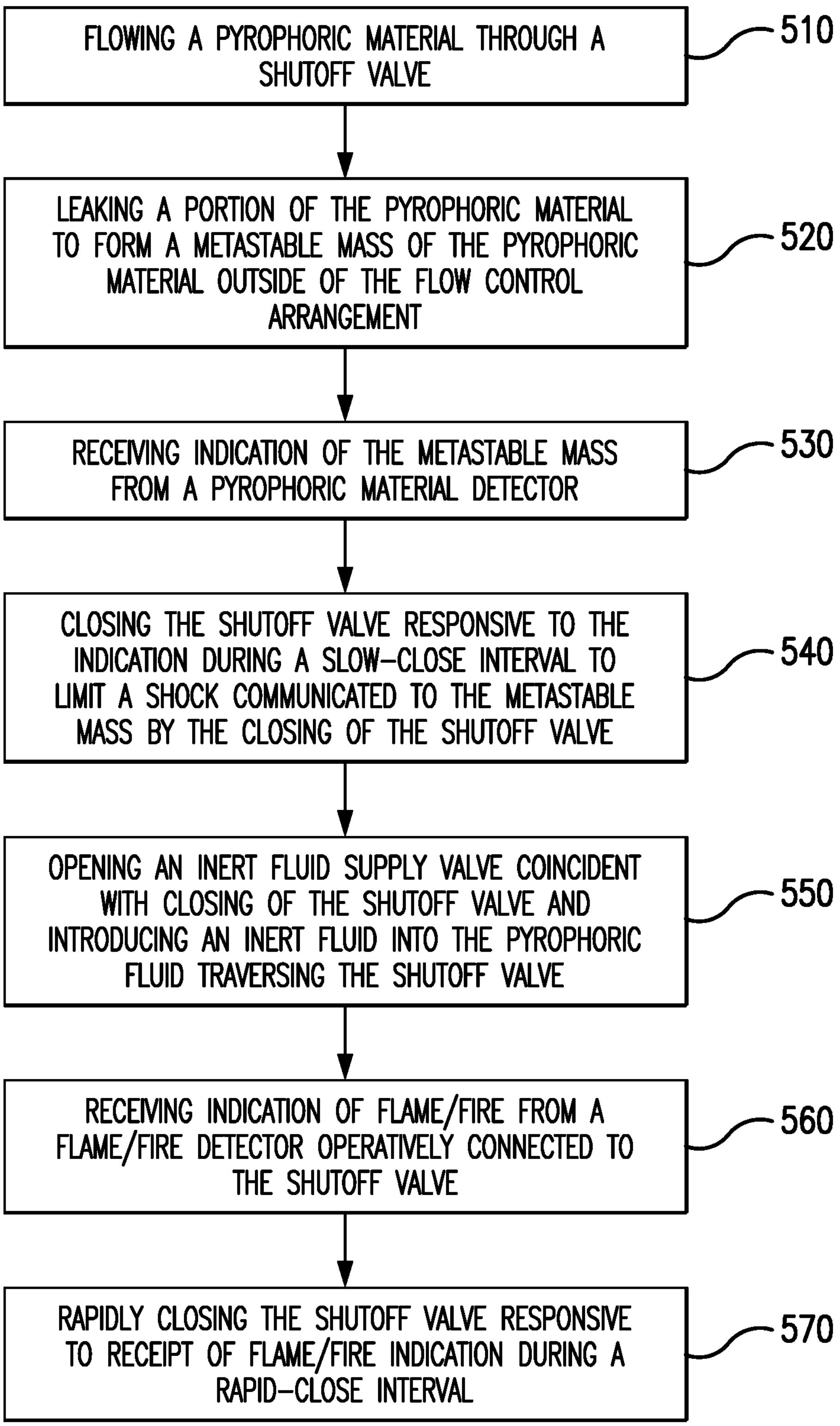
Figure 13:
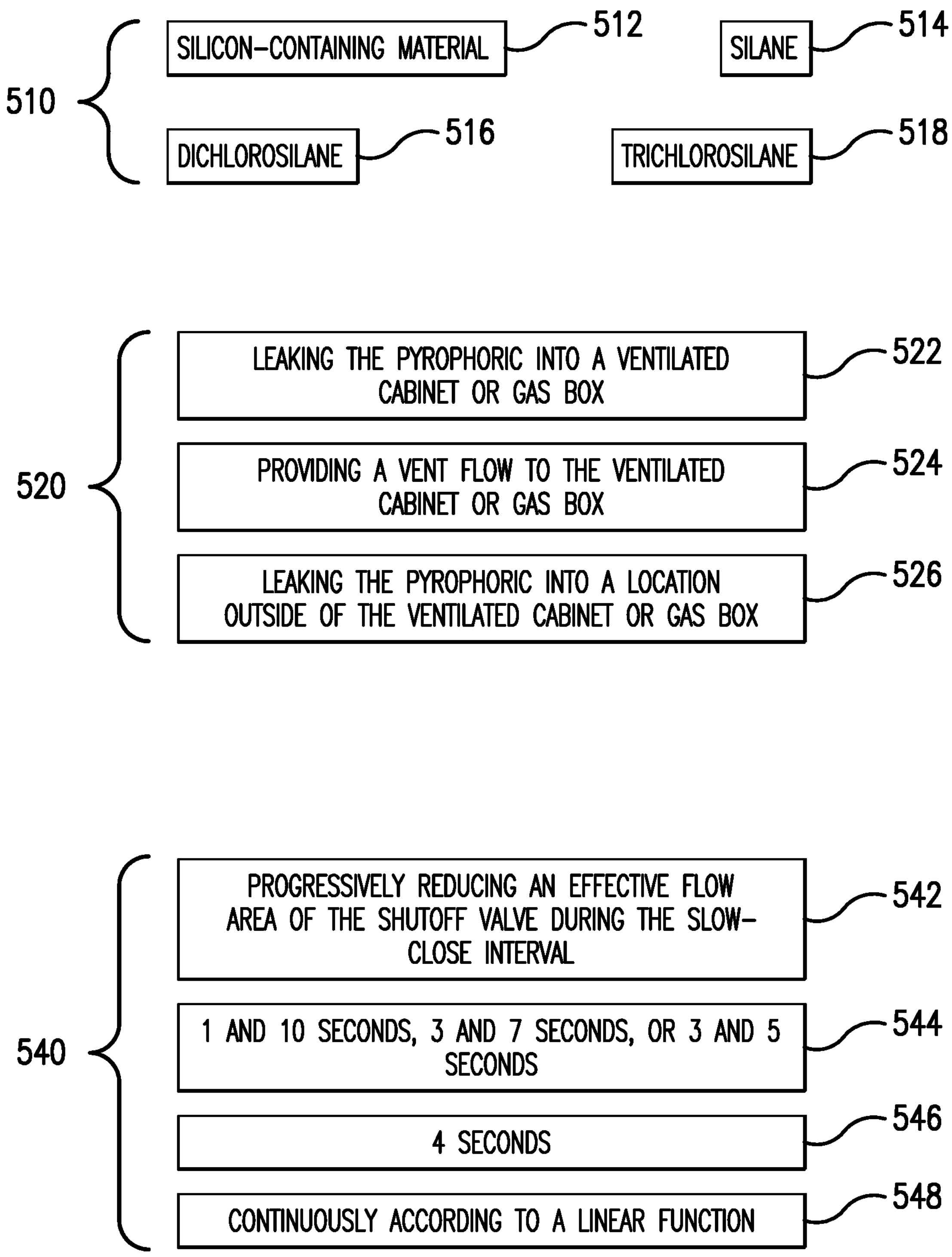
Figure 14:
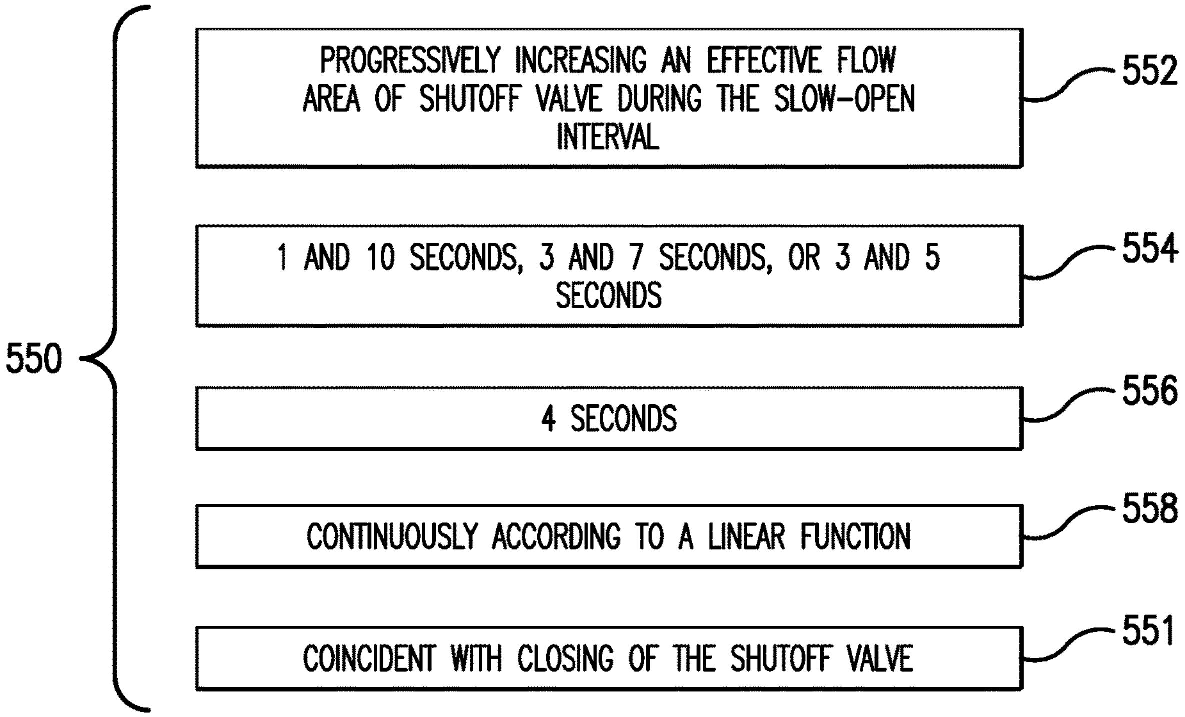

FIG. 7 is a graph of fluid pressure within the flow controller arrangement of FIGS. 5 and 6 during closing of the shutoff valve and opening of the inert fluid supply valve, showing increase in partial pressure of the inert fluid offsetting decrease in partial pressure of the pyrophoric fluid within the supply conduit during coincident closing of the shutoff valve and opening of the inert fluid supply valve, respectively;

FIGS. 8 and 9 are schematic views of the flow control arrangement of FIG. 1 according to a further example of the present disclosure, showing a shutoff valve with a pneumatic slow-close actuator fluidly coupling and fluidly separating the process chamber from the precursor source, respectively;

FIGS. 10 and 11 are schematic views of the flow control arrangement of FIG. 1 according to another example of the present disclosure, showing a shutoff valve with a pneumatic slow-close actuator and an inert fluid supply valve yoked to one another by an actuation valve to introduce an inert fluid into pyrophoric fluid traversing the shutoff valve during closing of the shutoff valve; and FIGS. 12-14 are block diagrams of a method of controlling flow of a fluid containing a pyrophoric material through a flow control arrangement, showing operations of the method according to an illustrative and non-limiting example of the method.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Reference will now be made to the drawings wherein like reference numerals identify similar structural features or aspects of the subject disclosure. For purposes of explanation and illustration, and not limitation, a semiconductor processing system including a flow control arrangement in accordance with the present disclosure is shown in FIG. 1 and is designated generally by reference character 10. Other examples of flow control arrangements, semiconductor processing systems having flow control arrangements, and flow control methods in accordance with the present disclosure, or aspects thereof, are provided in FIGS. 2-14, as will be described. The systems and methods of the present disclosure may be used to control flow of fluids containing pyrophoric materials, such as pyrophoric materials contained in precursors provided to semiconductor processing systems during the deposition of material layers on substrates for fabricating semiconductor devices, though the present disclosure is not limited to any particular type of semiconductor processing systems employed for material layer deposition or to semiconductor device fabrication in general.

Referring to FIG. 1, the semiconductor processing system 10 is shown. The semiconductor processing system 10 include a precursor source 12, an inert fluid source 14, a flow control arrangement 100, and a ventilated cabinet or gas box 16. The semiconductor processing system 10 also includes a ventilation source 18, a metering valve 20, and a fire/flame detector 22. The semiconductor processing system 10 further includes a process chamber 24, a substrate support 26, and an exhaust source 28. Although shown and described herein as having a specific arrangement, it is to be understood and appreciated that semiconductor processing systems having configuration differing from that shown and described herein may also benefit from the present disclosure and therefore are within the scope of the present disclosure.

The precursor source 12 is connected to the flow control arrangement 100 and is configured to provide a flow containing a pyrophoric material 30 to the flow control arrangement 100. The inert fluid source 14 is also connected to the flow control arrangement 100 an dis configured to provide a flow of an inert fluid 32 to the flow control arrangement 100. In certain examples, the pyrophoric material 30 may include a pyrophoric material layer precursor, such as a chlorinated silicon-containing precursor and/or a non-chlorinated silicon-containing material layer precursor, suited for the deposition of epitaxial material layers. Non-limiting examples of silicon-containing material layer precursors include silane ($SiH_4$), disilane ($Si_2H_6$), trisilane $H_2Si(SiH_3)_2$, dichlorosilane ($H_2SiCl_2$), trichlorosilane ($HCl_3Si$) and mixtures thereof the aforementioned gases. In accordance with certain examples, the inert fluid 32 may include an inert fluid. Examples of suitable inert fluids include nitrogen ($N_2$) gas, argon (Ar) gas, helium (He) gas, krypton (Kr) gas, and mixtures thereof.

The metering valve 20 is connected to the flow control arrangement 100 and is configured to meter flow of the pyrophoric material 30 to the process chamber 24. In certain examples, the metering valve 20 may be enclosed within the ventilated cabinet or gas box 16. In accordance with certain examples, the ventilation source 18 may be fluidly coupled to an interior of the ventilated cabinet or gas box 16 to drive a flow of a vent fluid 36 through the interior of the ventilated cabinet or gas box 16. The vent fluid 36 may include air, such as air made up from a cleanroom environment within which the semiconductor processing system 10 is arranged.

The process chamber 24 is connected to the metering valve 20 and houses the substrate support 26. The process chamber 24 is further is configured to flow the pyrophoric material 30 across a substrate 2 supported within the process chamber 24 under conditions selected to cause a material layer 4 to deposit on the substrate 2. The substrate support 26 is arranged within the process chamber 24 and is configured to support the substrate 2 during deposition of the material layer 4 onto the substrate 2. In certain examples, the substrate support 26 may be configured to support a single substrate during deposition of a material layer onto the substrate. In accordance with certain examples, the substrate support 26 may be configured to support two or more substrates during deposition of material layers onto the substrates, such as in a mini-batch or batch-type process chamber.

As used herein, the term "substrate" may refer to any underlying material or materials that may be used, or upon which, a device, a circuit, or a film may be formed. The "substrate" may be continuous or non-continuous; rigid or flexible; solid or porous. The substrate may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide.

A substrate in the form of a powder may have a potential application for pharmaceutical manufacturing. A porous substrate may comprise polymers. Workpieces may comprise medical devices (i.e. stents, syringes, etc.), jewelry, tooling devices, components for battery manufacturing (i.e., anodes, cathodes, or separators) or components of photovoltaic cells.

A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e. ceramic fibers or polymer fibers). Continuous substrates may also comprise carriers or sheets upon which non-continuous substrates are mounted.

With continuing reference to FIG. 1, the exhaust source 28 is connected to the process chamber 24 and is configured to receive a flow of residual pyrophoric material and/or reaction products 38 issued by the process chamber 24. The exhaust source 28 is further configured to communicate the residual pyrophoric material and/or reaction products 38 the external environment 40. In certain examples, the exhaust source 28 may include one or more vacuum pumps. In accordance with certain examples, the exhaust source may include an abatement apparatus, such as a scrubber by way example.

The fire/flame detector 22 is arranged in outside of the flow control arrangement 100 and is configured to detect one or more of fire, flame, and smoke outside of the flow control arrangement 100. In this respect the fire/flame detector 22 may one or more of an infrared or an ultraviolet sensor configured to provide an indication of fire, flame, and/or smoke outside of the semiconductor processing system 10. In further respect, the fire/flame detector 22 may be configured to generate a fire/flame indication signal when fire, flame, or smoke is present outside of the flow control arrangement 100. The fire/flame indication signal may be provided to a shutoff device, such as the shutoff valve 104 (shown in FIG. 2), to effect rapid shutoff of the flow of the pyrophoric material 30 to the process chamber 24.

As has been explained above, leakage of a pyrophoric material (e.g., the pyrophoric material 30) can cause the pyrophoric material to form a metastable mass (e.g., the metastable mass 42) outside of the flow control arrangement 100. Once formed the metastable mass may potentially rapidly deflagrate or detonate, potentially causing injury to personnel and/or damage to equipment in proximity of the metastable mass. For example, rapid shutoff of flow of the pyrophoric material may itself, through mechanical or fluid coupling of the pyrophoric fluid through a leakage path, may be sufficient to cause rapid deflagration or detonation of the metastable mass of pyrophoric fluid. To limit such risk of deflagration or detonation, the flow control arrangement 100 is provided.

Figure 2:
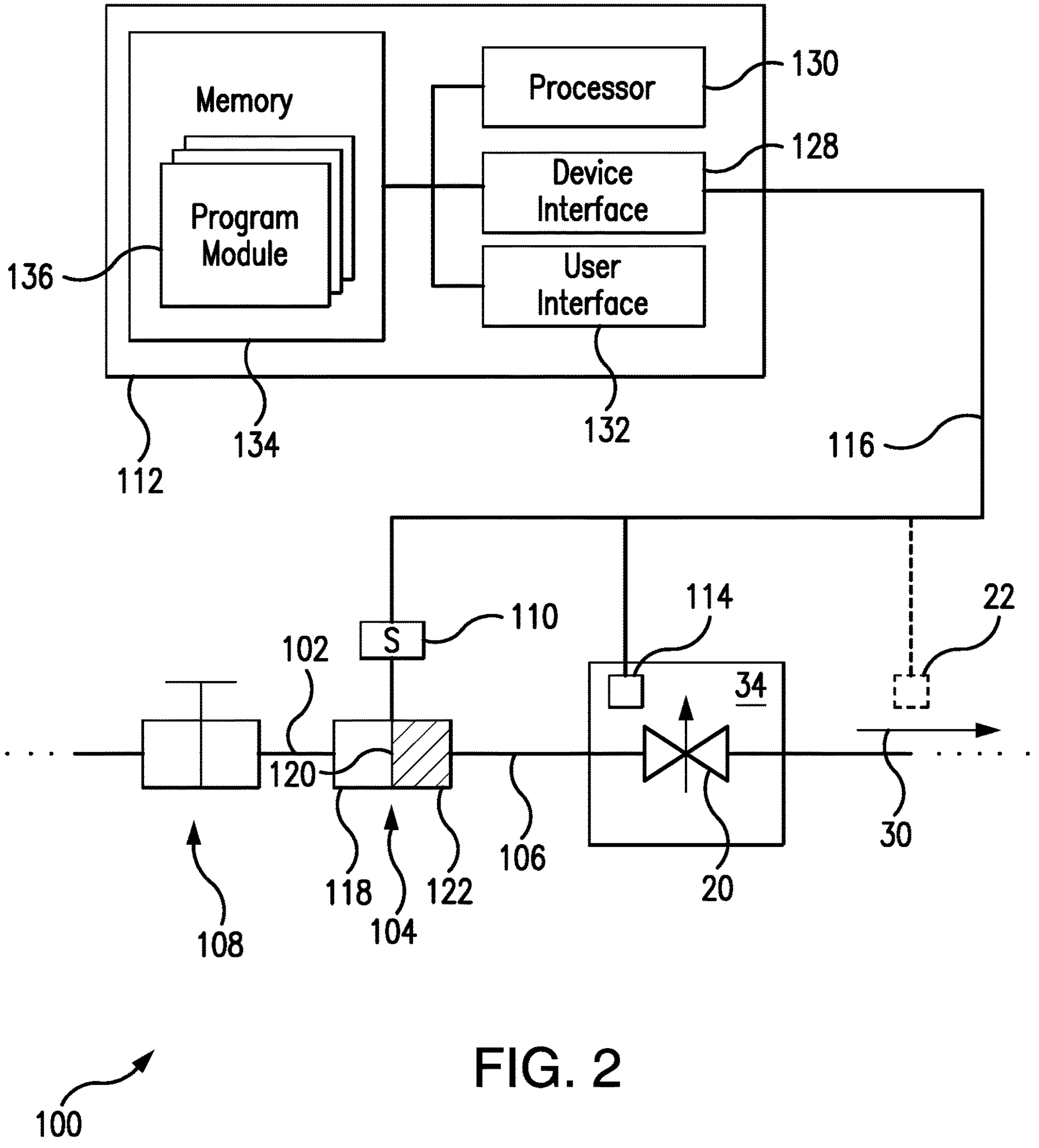
FIGS. 2 and 3 are schematic views of the flow control arrangement of FIG. 1 according to an example, showing a shutoff valve with a slow-close actuator fluidly coupling and fluidly separating the process chamber from the precursor source, respectively.

With reference to FIG. 2, the flow control arrangement 100 is shown. In the illustrated example the flow control arrangement 100 includes a source conduit 102, a shutoff valve 104, and a supply conduit 106. The flow control arrangement 100 also includes a manual valve 108, a slow-close actuator 110 (e.g., a solenoid slow-close actuator), and a controller 112. The flow control arrangement 100 further includes a pyrophoric material detector 114 and a wired or wireless link 116. As will be appreciated by those of skill in the art in view the present disclosure, the flow control arrangement 100 may differ in arrangement in other examples of the present disclosure, e.g., include other elements and/or omit elements shown and described herein, and remain within the scope of the present disclosure.

The source conduit 102 is connected to the precursor source 12 (shown in FIG. 1). The shutoff valve 104 is connected the source conduit 102 and connects the source conduit 102 to the supply conduit 106. The supply conduit 106 is connected to the shutoff valve 104 and connects the shutoff valve 104 to the metering valve 20. The metering valve 20 is connected to the supply conduit 106 and connects the supply conduit 106 to the process chamber 24 (shown in FIG. 1). The manual valve 108 is connected to the source conduit 102 and is fluidly coupled therethrough to the shutoff valve 104. The pyrophoric material detector 114 may arranged within the ventilated cabinet or gas box 16, may be arranged outside of the ventilated cabinet or gas box 16, or may be one of an array arranged both within and outside of the ventilated cabinet or gas box 16.

The shutoff valve 104 includes a valve body 118 and a closure 120. The valve body 118 connects the supply conduit 106 to the source conduit 102 such that the process chamber 24 (shown in FIG. 1) is in selective fluid communication with the source conduit 102 through the shutoff valve 104. The closure 120 is supported for movement within the valve body 118 for movement within the valve body 118 between a first position 122 (e.g., an open position), wherein the shutoff valve 104 fluidly couples the supply conduit 106 to the source conduit 102, and a second position 124 (shown in FIG. 3), which may be a closed position, wherein the shutoff valve 104 fluidly separates the supply conduit 106 from the source conduit 102. In certain examples, the valve body 118 may fluidly couple the supply conduit 106 to the source conduit 102 when the closure 120 is in the first position 122 and the closure 120 may fluidly separate the supply conduit 106 from the source conduit 102 when the closure 120 is in the second position 124. In accordance with certain examples, the shutoff valve 104 may configured as a normally open valve. In such examples the shutoff valve 104 may include a biasing member arranged between the closure 120 and the valve body 118 urging the closure 120 toward the first position 122.

The slow-close actuator 110 is operably connected to the shutoff valve 104. More specifically, the slow-close actuator 110 is operably connected to the shutoff valve 104 to close the shutoff valve 104 during a slow-close interval 126 (shown in FIG. 4). Specifically, the slow-close actuator 110 is operably connected to move the closure between the first position 122 and the second position 124 during the slow-close interval 126. In the certain examples, the slow-close actuator 110 may include a solenoid 128. The solenoid 128 may be operably connected to the closure 120 and configured to move the closure from the first position 122 to the second position 124 during the slow-close interval 126. In accordance with certain examples, the solenoid 128 may be configured to move the closure 120 from the first position 122 to the second position 124 during the slow-close interval 126 responsive to receipt of a slow-close actuation signal 130. In this respect the slow-close actuation signal 130 may cause the solenoid 128 to be energized, such as by causing a relay connecting the solenoid 128 to a power supply to close, the solenoid 128 thereby causing the closure 120 to move between the first position 122 and the second position 124 during the slow-close interval 126.

The controller 112 includes a device interface 132, a processor 134, a user interface 136, and a memory 138. The device interface 132 is connected to the wired or wireless link 116 and is connected therethrough to the slow-close actuator 110 and the pyrophoric material detector 114. The processor 134 is operably connected to the user interface 136 to receive user input and/or provide user output through the user interface 136 and is further connected to the device interface 132 and disposed in communication with the memory 138 for communication through the wired or wireless link 116. The memory 138 includes a non-transitory machine-readable medium having a plurality of program modules 140 recorded thereon containing instructions that, when read by the processor 134, cause the processor 134 to execute certain operations. Among the operations are operations of a flow control method 500 (shown in FIG. 12), as will be described.

The pyrophoric material detector 114 is operably connected to the slow-close actuator 110. More specifically, the pyrophoric material detector 114 is operably connected to the slow-close actuator 110 to close the shutoff valve 104 upon detection of the metastable mass 42 (shown in FIG. 1) of the pyrophoric material 30 disposed outside of the flow control arrangement 100. In certain examples, the pyrophoric material detector 114 may be connected to the controller 112 by the wired or wireless link 116 and operably connected to the slow-close actuator 110 through the controller 112. In accordance with certain examples, the pyrophoric material detector 114 may be configured to provide a metastable mass indication signal 142 upon detection of the metastable mass 42 (shown in FIG. 1). It is contemplated that, in certain examples, the pyrophoric material detector 114 may be arranged within the ventilated cabinet or gas box 16. It is also contemplated that, in accordance with certain examples, the pyrophoric material detector 114 may cooperate with the fire/flame detector 22 (shown in FIG. 1) to provide overlapping protection in the event of pyrophoric material leakage that accumulates outside of flow control arrangement 100 as well as pyrophoric material leakage that results in fire or flame.

As shown in FIG. 2, when the metastable mass 42 (shown in FIG. 1) is not present outside of the flow control arrangement 100 and fluidly coupled to the pyrophoric material 30 traversing the shutoff valve 104 and the supply conduit 106, the supply conduit 106 remains fluidly coupled to the source conduit 102. Fluid coupling of the supply conduit 106 to the source conduit 102 causes the pyrophoric material 30 provided by the precursor source 12 (shown in FIG. 1) to flow to the metering valve 20 and therethrough to the process chamber 24. The process chamber 24 flows the pyrophoric material across the substrate 2 (shown in FIG. 1), exposing the substrate 2 to the pyrophoric material 30 and causing the material layer 4 to deposit onto the substrate 2.

Figure 3:
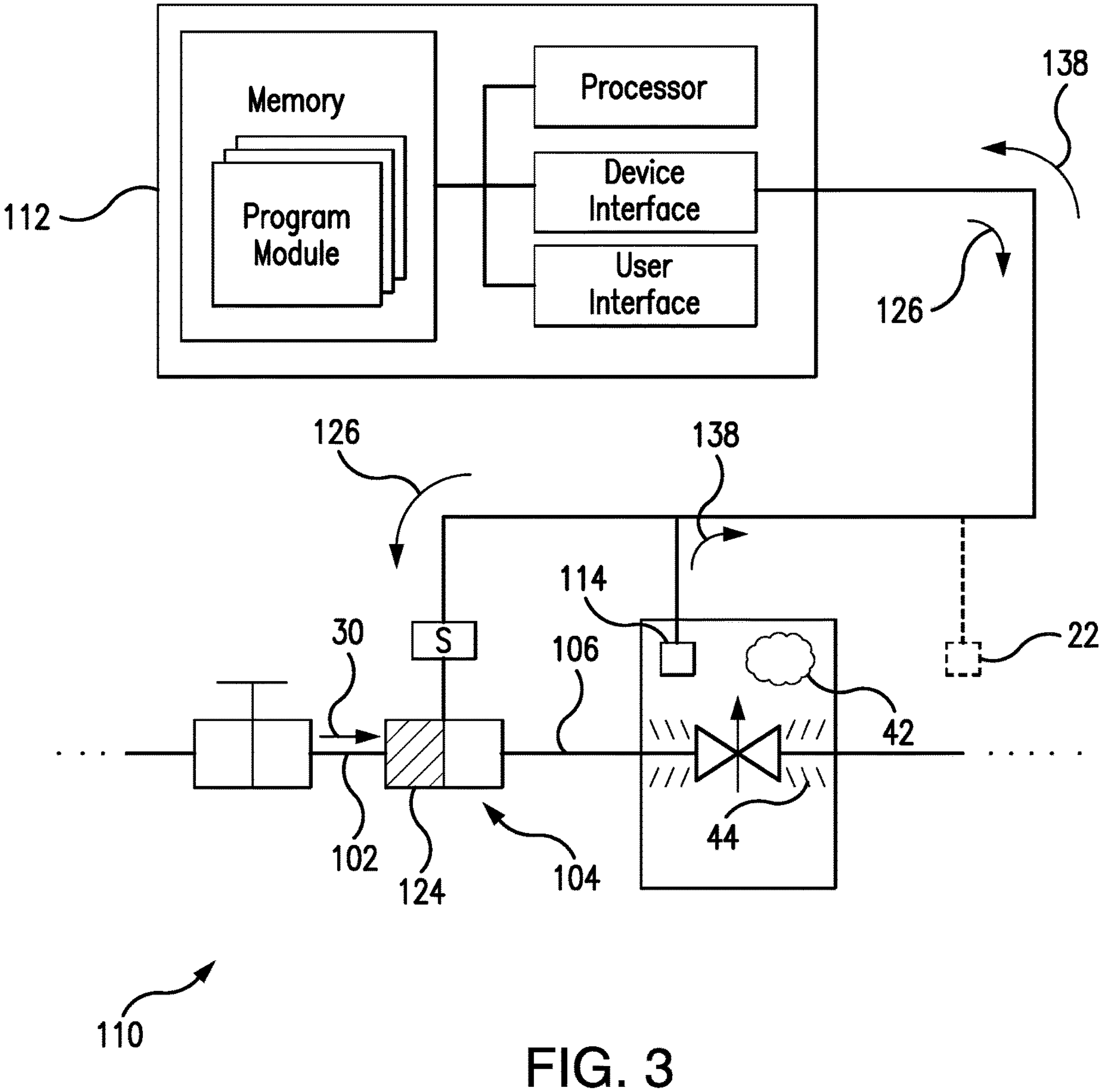

As shown in FIG. 3, detection of the metastable mass 42 causes the pyrophoric material detector 114 to provide the metastable mass indication signal 142 to the controller 112. Responsive to the metastable mass indication signal 142, the controller 112 provides the slow-close actuation signal 130 to the slow-close actuator 110. Responsive to receipt to the slow-close actuation signal 130, the slow-close actuator 110 causes the shutoff valve 104 to close, the shutoff valve 104 thereby fluidly separating the supply conduit 106 from the source conduit 102. More specifically, the slow-close actuator 110 causes the shutoff valve 104 to progressively reduce an effective flow area 144 of the shutoff valve 104 during the slow-close interval 126, limiting a shock 44 communicated to the metastable mass 42 by the pyrophoric material 30 traversing the shutoff valve 104 and in communication with the metastable flow rate (e.g., pressure and/or mass flow rate) associated with closing of the shutoff valve 104. Advantageously, limiting (or eliminating) the shock 44 communicated to the metastable mass 42 limits likelihood that closing of the shutoff valve 104 triggers rapid deflagration or detonation of the metastable mass 42 that could otherwise result from shutoff of flow of the pyrophoric material 30 to the process chamber 24 (shown in FIG. 1).

Figure 4:
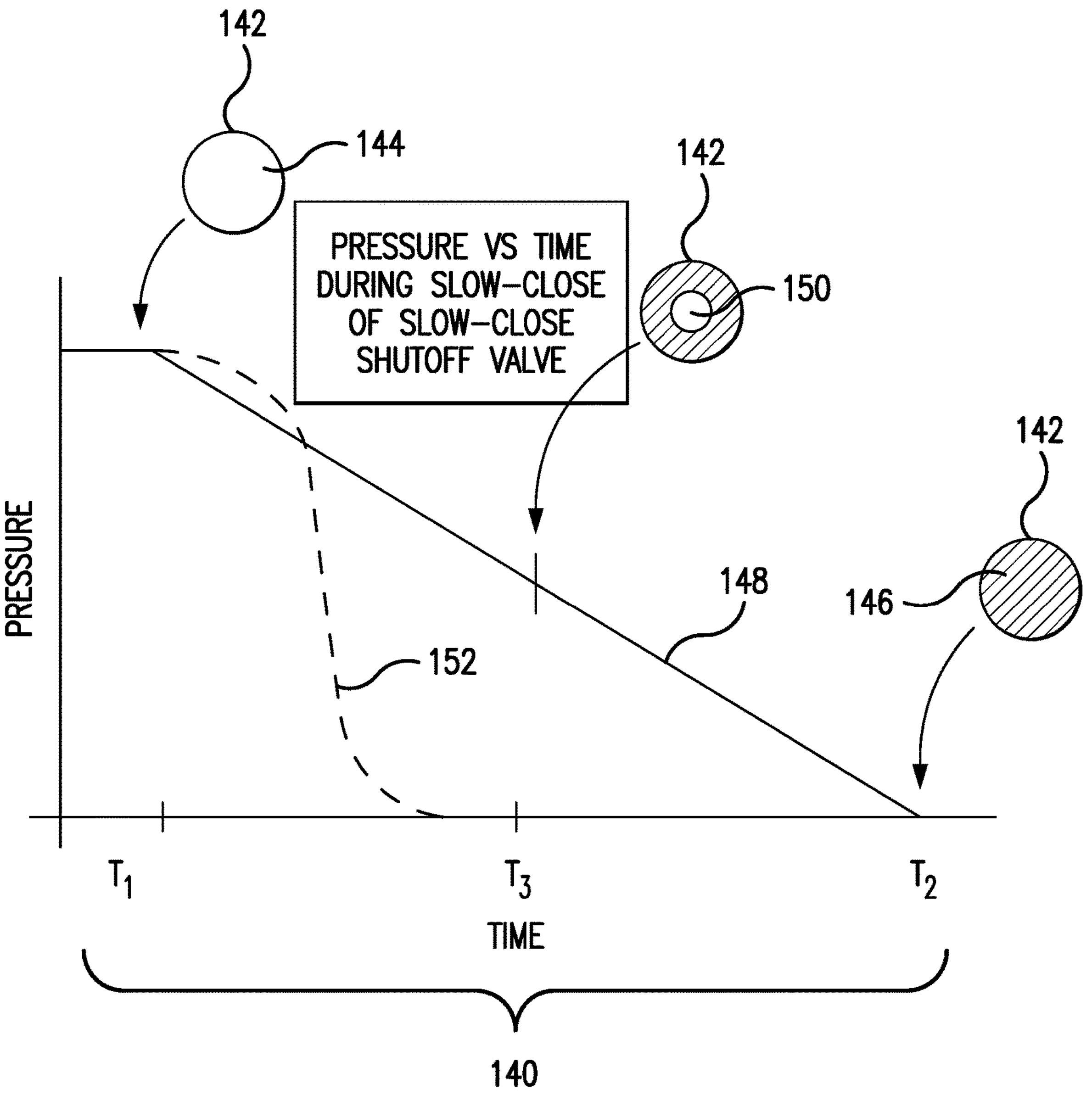
FIG. 4 is a graph of fluid pressure within the flow control arrangement of FIGS. 2 and 3 during closing of the shutoff valve, showing the fluid pressure progressively decreasing during closing of the shutoff valve.

With reference to FIG. 4, it is contemplated that the effective flow area 144 of the shutoff valve 104 be progressively reduced during the slow-close interval 126 from a first effective flow area 146 to a second effective flow area 148, the second effective flow area 148 smaller than the first effective flow area 146. The first effective flow area 146 may be defined within the shutoff valve 104 when the closure 120 is in the first position 122, and the second effective flow area 148 may be defined within the shutoff valve 104 when the closure 120 is in the second position 124. In certain examples, the first effective flow area 146 may be a nominal or maximum effective flow area of the shutoff valve 104. In accordance with certain examples, the second effective flow area 148 may be a minimum effective flow area of the shutoff valve 104, for example, a fluid-tight effective flow area wherein substantially no fluid traverses the shutoff valve 104.

It is contemplated that the shutoff valve 104 fluidly couple the supply conduit 106 (shown in FIG. 2) with the first effective flow area 146 at a start $T_1$ of the slow-close interval 126, that the shutoff valve 104 define the second effective flow area 148 at an end $T_2$ of the slow-close interval 126, and that effective flow area 144 of the shutoff valve 104 progressively decrease during the duration of the slow-close interval 126. Closing of the shutoff valve 104 may be according to closing function 150 that is continuous between the start $T_1$ of the slow-close interval 126 and the end $T_2$ of the slow-close interval 126. In certain examples, the closing function 150 may be a linear closing function, an intermediate effective flow area 152 defined at a midpoint $T_3$ of the closing function 150 being about one-half the first effective flow area 146.

In certain examples, the slow-close interval 126 may be greater than a rapid-close interval 154 associated with a fire/flame indication signal provided by the fire/flame detector 22, which may cause a shutoff valve or the shutoff valve 104 to rapidly close during the rapid-close interval 154. In this respect the slow-close interval 126 may be between about 1 second and about 10 seconds, or between about 3 seconds and about 7 seconds, or even between about 3 seconds and about 5 seconds. The slow-close interval 126 may be about 4 seconds. Applicant has determined that, while closing the shutoff valve 104 rapidly during the rapid-close interval 154 upon the detection of fire or flame may be present, rapid closing of the shutoff valve 104 when the metastable mass 42 is present may cause rapid deflagration or detonation of the metastable mass 42. Therefore, responsive to detection of the metastable mass 42, the slow-close actuator closes the shutoff valve 104 using the slow-close interval 126. Advantageously, closing the shutoff valve 104 using the slow-close interval 126 can limit (or eliminate) risk of rapid deflagration or detonation of the metastable mass 42 by limiting (or eliminating) shock communicated to the metastable mass 42 by the pyrophoric material 30 traversing the shutoff valve 104 at the start $T_1$ of the closing of the shutoff valve 104, such as through a pressure impulse that may be communicated through pyrophoric material 30 downstream of the shutoff valve 104 and/or a mechanical impulse through fluid-conveying structure of the flow control arrangement 100 itself during closing of the shutoff valve 104.

With reference to FIG. 5, a flow control arrangement 200 is shown. The flow control arrangement 200 is similar to the flow control arrangement 100 (shown in FIG. 1) and additionally includes union or tee fitting 202, an inert fluid conduit 204, and inert fluid supply valve 206. The flow control arrangement 200 also includes a slow-open actuator 208 (e.g., a solenoid slow-open actuator). As will be appreciated by those of skill in the art in view the present disclosure, the flow control arrangement 200 may differ in arrangement in other examples of the present disclosure, e.g., include other elements and/or omit elements shown and described herein, and remain within the scope of the present disclosure.

The union or tee fitting 202 is connected to the supply conduit 106 and connect the inert fluid conduit 204 to the supply conduit 106. The supply conduit 106 is connected to the union or tee fitting 202 and connects the inert fluid source 14 to inert fluid conduit 204. The inert fluid source 14 is further configured to provide the inert fluid 32 to the inert fluid conduit 204 and therethrough, selectively, during the duration of the slow-close interval 126 (shown in FIG. 4). The inert fluid supply valve 206 is connected to the inert fluid conduit 204 and is configured to provide selective fluid communication between the inert fluid source 14 and the supply conduit 106 through the inert fluid conduit 204 and the union or tee fitting 202 to provide the inert fluid 32 to the supply conduit 106 during the slow-close interval 126.

The inert fluid supply valve 206 includes a valve body 210 and a valve member 212. The valve body 210 connects the inert fluid source 14 to the union or tee fitting 202 and therethrough to the supply conduit 106. The valve member 212 is supported within the valve body 210 for movement between a first position 214 and a second position 216 (shown in FIG. 6). When the valve member 212 is in the first position 214, the valve member 212 fluidly separates the inert fluid source 14 (shown in FIG. 1) from the supply conduit 106. When the valve member 212 is in the second position 216, the valve body 210 fluidly couples the inert fluid source 14 to the supply conduit 106. As will be appreciated by those of skill in the art in view of the present disclosure, the inert fluid 32 does not flow from the inert fluid source 14 to the supply conduit 106 when the valve member 212 is in the first position 214. As will also be appreciated by those of skill in the art in view of the present disclosure, the inert fluid 32 flows from the inert fluid source 14 to the supply conduit 106 when the valve member 212 is in the second position 216. In certain examples, the inert fluid supply valve 206 may be configured as a normally closed inert fluid supply valve, and include a biasing member arranged between the valve body 210 and the valve member 212 urging the valve member 212 toward the second position 216.

The slow-open actuator 208 is connected to the inert fluid supply valve 206 to open the inert fluid supply valve 206 during the slow-close interval 126 (shown in FIG. 4). Opening of inert fluid supply valve 206 may be accomplished by moving the valve member 212 within the valve body 210 between the first position 214 to the second position 216. In the illustrated example slow-open actuator 208 includes a solenoid 218. The solenoid 218 may be operatively connected to the valve member 212 to move the valve member 212 from the first position 214 to the second position 216. The solenoid 218 may further be operatively associated with the pyrophoric material detector 114 for coincident opening of the inert fluid supply valve 206 with closing of the shutoff valve 104. In this respect the solenoid 218 may be connected to the controller 112 by the wired or wireless link 116, and the controller 112 may further be configured to provide the slow-open actuation signal 220 to the solenoid 218 to open the inert fluid supply valve 206 coincident with closing of the shutoff valve 104 responsive to receipt of metastable mass indication signal 142 (shown in FIG. 3) from the pyrophoric material detector 114. Advantageously, coincident opening of the inert fluid supply valve 206 with closing of the shutoff valve 104 may further reduce risk that the closing of the shutoff valve 104 cause rapid deflagration or detonation of the metastable mass 42 of the pyrophoric material 30, for example, by limiting pressure change within the supply conduit 106 during the closing of the shutoff valve 104.

As shown in FIG. 5, when the metastable mass 42 (shown in FIG. 1) is not present outside of the flow control arrangement 200 and fluidly coupled to the pyrophoric material 30 traversing the shutoff valve 104 and the supply conduit 106, the supply conduit 106 remains fluidly coupled to the source conduit 102. Fluid coupling of the supply conduit 106 to the source conduit 102 causes the pyrophoric material 30 provided by the precursor source 12 (shown in FIG. 1) to flow to the metering valve 20 and therethrough to the process chamber 24. The process chamber 24 flows the pyrophoric material across the substrate 2 (shown in FIG. 1), exposing the substrate 2 to the pyrophoric material 30 and causing the material layer 4 to deposit onto the substrate 2.

As shown in FIG. 6, detection of the metastable mass 42 by the pyrophoric material detector 114 outside of the flow control arrangement 200 causes the pyrophoric material detector 114 to provide the metastable mass indication signal 142 to the controller 112. Responsive to the metastable mass indication signal 142, the controller 112 in turn provides the slow-close actuation signal 130 and the slow-open actuation signal 220 to the shutoff valve 104 and the inert fluid supply valve 206, respectively. As has been explained above, receipt of the slow-close actuation signal 130 and the slow-open actuation signal 220 by the shutoff valve 104 and the inert fluid supply valve 206 causes the shutoff valve 104 to close and the inert fluid supply valve 206 to open. Notably, as the opening of the inert fluid supply valve 206 and the shutoff valve 104 are coincident, the inert fluid 32 is introduced into the flow of pyrophoric material 30 traversing the supply conduit 106, increasing partial pressure of the inert fluid 32 offsetting decreasing partial pressure of the pyrophoric material 30 during the slow-close interval 126. As will be appreciated by those of skill in the art of the present disclosure, offsetting decrease in flow of the pyrophoric material 30 with flow of the inert fluid 32 may further limit shock communicated to the metastable mass 42 by the closing the of the shutoff valve 104.

With reference to FIG. 7, it is contemplated that the inert fluid supply valve 206 (shown in FIG. 5) open during a slow-open interval 222. During the slow-open interval 222, an effective flow area 224 increases from a first effective flow area 226 to a second effective flow area 228. The first effective flow area 226 may be defined within the inert fluid supply valve 206 when the valve member 212 is in the first position 214, and the second effective flow area 228 may be defined within the inert fluid supply valve 206 when the valve member 212 is in the second position 216. In certain examples, the first effective flow area 226 may be a minimum effective flow area of the inert fluid supply valve 206. For example, the first effective flow area 226 may be a fluid-tight condition of the inert fluid supply valve 206 wherein none of the inert fluid 32 traverses the inert fluid supply valve 206. In accordance with certain examples, the second effective flow area 228 may be a nominal or maximum effective flow area of the inert fluid supply valve 206.

The inert fluid supply valve 206 (shown in FIG. 5) may fluidly separate the inert fluid source 14 (shown in FIG. 1) from the supply conduit 106 (shown in FIG. 2) at the start $T_1$ of the slow-close interval 126 (shown in FIG. 4), the inert fluid supply valve 206 defining the first effective flow area 226 at the start $T_1$. The inert fluid supply valve 206 may further fluidly couple the inert fluid source 14 to the supply conduit 106 at the end $T_2$ of the slow-close interval 126, the inert fluid supply valve 206 defining the second effective flow area 228 at the end $T_2$ of the slow-close interval 126. In certain examples, the slow-open interval 222 may extend between the start $T_1$ and the close $T_2$ of the slow-close interval 126. In accordance with certain examples, the slow-open interval 222 of the slow-open actuator 208 may be substantially equivalent to the slow-close interval 126 of the shutoff valve 104. It also contemplated that, in accordance with certain examples, the inert fluid supply valve 206 may open according to an opening function 232 mirroring the closing function 150 of the shutoff valve 104. For example, the inert fluid supply valve 206 may define an intermediate effective flow area 230 that is one-half the second effective flow area 228 at the midpoint $T_3$ of the slow-close interval 126. As will be appreciated by those of skill in the art in view of the present disclosure, increasing partial pressure of the inert fluid 32 provided to the supply conduit 106 coincident with decreasing partial pressure of the pyrophoric material 30 provided to the supply conduit 106 during the slow-close interval 126 offsets pressure change within the supply conduit 106 during closing of the shutoff valve 104, further limiting (or eliminating) shock communicated to the metastable mass 42 otherwise associated with the closing of the shutoff valve 104, as shown in FIG. 7 with a total pressure trace 234.

With reference to FIG. 8, a flow control arrangement 300 is shown. The flow control arrangement 300 is similar to the flow control arrangement 100 (shown in FIG. 1) and additionally includes a shutoff valve 302 (e.g., a pneumatic slow-close shutoff valve), a pneumatic slow-close actuator 304, and a pneumatic actuation conduit 306. The flow control arrangement 300 also includes a pneumatic source 308, an actuation valve 310, and slow-close restrictive flow orifice (RFO) 312. As will be appreciated by those of skill in the art in view the present disclosure, the flow control arrangement 300 may differ in arrangement in other examples of the present disclosure, e.g., include other elements and/or omit elements shown and described herein, and remain within the scope of the present disclosure.

The shutoff valve 302 connects the supply conduit 106 to the source conduit 102. The pneumatic slow-close actuator 304 is connected to the shutoff valve 302 to close the shutoff valve 302 during a slow-close interval, e.g., the slow-close interval 126 (shown in FIG. 4), and in this respect may include a slow-close pneumatic chamber 314 and a slow-close diaphragm member 316. The slow-close pneumatic chamber 314 is defined within a valve body 318 of the shutoff valve 302. The slow-close diaphragm member 316 is arranged within the slow-close pneumatic chamber 314, bounds the slow-close pneumatic chamber 314, and is movable between a first position 320 and a second position 322. When the slow-close diaphragm member 316 in the first position 320, the shutoff valve 302 fluidly couples the supply conduit 106 to the source conduit 102. When the slow-close diaphragm member 316 is in the second position 322, the shutoff valve 302 fluidly separates the supply conduit 106 from the source conduit 102. In the illustrated example movement of the slow-close diaphragm member 316 between the first position 320 and the second position 322 is responsive to pressure change within the slow-close pneumatic chamber 314, for example, responsive to introduction of an actuation fluid 324 into the slow-close pneumatic chamber 314.

The pneumatic actuation conduit 306 is connected to the shutoff valve 302. The pneumatic source 308 is connected to the pneumatic actuation conduit 306 and is configured to provide the actuation fluid 326 to the pneumatic actuation conduit 306. The actuation valve 310 is arranged along the pneumatic actuation conduit 306 and is configured to provide selective fluid communication between the pneumatic source 308 and the slow-close pneumatic chamber 314. In the illustrated example the actuation valve 310 has a valve body 328, a closure 330, and a pneumatic actuation solenoid 332. The closure 330 is supported within the valve body 328 and is movable between a first position 334 and a second position 336. When in the first position 334, the closure 330 fluidly separates the pneumatic source 308 from the slow-close pneumatic chamber 314. When in the second position 336, the actuation valve 310 fluidly couples the pneumatic source 308 to the slow-close pneumatic chamber 314. It is contemplated that the pneumatic actuation solenoid 332 be operatively connected to the closure 330 and connected to the controller 112 by the wired or wireless link 116 for moving the closure 330 between the first position 334 to the second position 336 responsive to the slow-close actuation signal 130 (shown in FIG. 1).

The slow-close RFO 312 is arranged along the pneumatic actuation conduit 306 and is configured to throttle flow of the actuation fluid 326 into the slow-close pneumatic chamber 314. In certain examples, the slow-close RFO 312 may be configured to throttle flow of the actuation fluid 326 to the shutoff valve 302 to define a slow-close interval, for example, during the slow-close interval 126 (shown in FIG. 1). In the illustrated example the slow-close RFO 312 is arranged between the actuation valve 310 and the shutoff valve 302 relative to the direction of flow of the actuation fluid 326 between the pneumatic source 308 and the shutoff valve 302, which can limit delay between movement of the closure 330 and arrival of the actuation fluid 326 at the slow-close pneumatic chamber 314. As will be appreciated by those of skill in the art in view of the present disclosure, the slow-close RFO 312 may also be placed between pneumatic source 308 and the actuation valve 310 and remain within the scope of the present disclosure. As will also be appreciated by those of skill in the art in view of the present disclosure, the slow-close RFO 312 may also be arranged on a vent line fluidly coupled to the slow-close pneumatic chamber 314, such as in a fail-closed arrangement of the shutoff valve 302, and remain within the scope of the present disclosure.

As shown in FIG. 8, it is contemplated that the shutoff valve 302 fluidly couple the supply conduit 106 to the source conduit 102 when the metastable mass 42 (shown in FIG. 1) is not present outside of the flow control arrangement 300. Fluid coupling of the supply conduit 106 to the source conduit 102 causes the shutoff valve 302 to communicate the pyrophoric material 30 to the metering valve 20 and therethrough to the process chamber 24. The process chamber 24 in turn flows the pyrophoric material 30 across the substrate 2 (shown in FIG. 1), the material layer 4 thereby depositing onto the substrate 2.

As shown in FIG. 9, when the pyrophoric material detector 114 detects the metastable mass 42 the pyrophoric material detector 114 provides the metastable mass indication signal 142 to the controller 112. Receipt of the metastable mass indication signal 142 at the controller 112 causes the controller 112 to provide the slow-close actuation signal 130 to the pneumatic actuation solenoid 332. Receipt of the slow-close actuation signal 130 at the pneumatic actuation solenoid 332 causes the pneumatic actuation solenoid 332 to move the closure 330 from the first position 334 (shown in FIG. 8) to the second position 336.

Movement of the closure 330 to the second position 336 fluidly couples the pneumatic source 308 to the slow-close pneumatic chamber 314, the actuation fluid 326 thereby flowing into the slow-close pneumatic chamber 314. Flow of the actuation fluid 326 into the slow-close pneumatic chamber 314 in turn cause the slow-close diaphragm member 316 to move to the second position 322, the shutoff valve 302 thereby fluidly separating the supply conduit 106 from the source conduit 102. As will be appreciated by those of skill in the art in view of the present disclosure, fluid separation of the supply conduit 106 from the source conduit 102 ceases flow of the pyrophoric material 30 to the process chamber 24. Notably, movement of the slow-close diaphragm member 316 occurs during the slow-close interval 126, the shock communicated to the metastable mass 42 of the pyrophoric material 30 is less than that required to cause rapid deflagration or detonation of the metastable mass 42.

With reference to FIG. 10, a flow control arrangement 400 is shown. The flow control arrangement 400 is similar to the flow control arrangement 100 (shown in FIG. 1) and additionally include a shutoff valve 402, a slow-close actuator 404, a union or tee fitting 406, and an inert fluid conduit 408. The flow control arrangement 400 also includes an inert fluid supply valve 410, a slow-open actuator 412, a slow-close pneumatic actuation conduit 414, and a slow-open pneumatic actuation conduit 416. In the illustrated example the flow control arrangement 400 additionally includes a slow-close RFO 418, a slow-open RFO 420, an actuation valve 422, a pneumatic source conduit 424, and a pneumatic source 426. As will be appreciated by those of skill in the art in view the present disclosure, the flow control arrangement 400 may differ in arrangement in other examples of the present disclosure, e.g., include other elements and/or omit elements shown and described herein, and remain within the scope of the present disclosure.

The shutoff valve 402 connects the supply conduit 106 to the source conduit 102 and is operably associated with the slow-close actuator 404. The slow-close actuator 404 includes a slow-close pneumatic chamber 428 and a slow-close diaphragm member 430. The slow-close pneumatic chamber 428 is defined within a valve body 432 of the shutoff valve 402 and is connected to the slow-close pneumatic actuation conduit 414. The slow-close diaphragm member 430 is arranged within the slow-close pneumatic chamber 428 and at least partially bound the slow-close pneumatic chamber 428. The slow-close diaphragm member 430 is further movable between a first position 434 and a second position 436 (shown in FIG. 11). When the slow-close diaphragm member 430 is in the first position 434, the shutoff valve 402 fluidly couples the supply conduit 106 to the source conduit 102. When the slow-close diaphragm member 430 is in the second position 436, the shutoff valve 402 fluidly separates the supply conduit 106 from the source conduit 102. In the illustrated example the shutoff valve 402 is configured as a pneumatically actuated shutoff valve with a normally-open arrangement. However, it is to be understood and appreciated that the shutoff valve 402 may have different configuration and/or arrangements in other examples and remain within the scope of the present disclosure.

The inert fluid supply valve 410 connects the inert fluid source 14 to the supply conduit 106 through the inert fluid conduit 408 and is configured to provide selective fluid communication between the inert fluid source 14 and the supply conduit 106. In this respect the inert fluid supply valve 410 is arranged along the inert fluid conduit 408 and is operably associated with the slow-open actuator 412. The slow-open actuator 412 is connected to the inert fluid supply valve 410 and includes a slow-open pneumatic chamber 438 and a slow-open diaphragm member 440. The slow-open pneumatic chamber 438 is defined within a valve body 442 of the inert fluid supply valve 410, and is connected to the slow-open pneumatic actuation conduit 416. The slow-open diaphragm member 440 is arranged within the slow-open pneumatic chamber 438, at least partially bounds the slow-open pneumatic chamber 438, and is movable between a first position 448 and a second position 450 (shown in FIG. 11).

When the slow-open diaphragm member 440 is in the first position 448 the inert fluid supply valve 410 fluidly separates the inert fluid source 14 from the supply conduit 106. When the slow-open diaphragm member 440 is in the second position 450 (shown in FIG. 11), the inert fluid supply valve 410 fluidly couples the inert fluid source 14 to the supply conduit 106. Fluid coupling is accomplished through the union of tee fitting 406, which may be arranged along the supply conduit 106 and which may connect the inert fluid conduit 408 to the supply conduit 106. In the illustrated example the inert fluid supply valve 410 is configured as a pneumatically actuated normally-open fluid supply valve. However, it is to be understood and appreciated that the inert fluid supply valve 410 may have different configurations and/or arrangements in other examples and remain within the scope of the present disclosure.

The actuation valve 422 is connected to the slow-close pneumatic actuation conduit 414 and is fluidly coupled therethrough to the shutoff valve 402 and the slow-close pneumatic chamber 428 therein. The actuation valve 422 is further connected to slow-open pneumatic actuation conduit 416 and is fluidly coupled therethrough to the inert fluid supply valve 410 and the slow-open pneumatic chamber 438 therein. The pneumatic source conduit 424 is connected to the actuation valve 422 and is in selective fluid communication through the actuation valve 422 with the shutoff valve 402 and the inert fluid supply valve 410 through the slow-close pneumatic actuation conduit 414 and the slow-open pneumatic actuation conduit 416, respectively. It is contemplated that the pneumatic source 426 be connected to the pneumatic source conduit 424, that the pneumatic source 426 be fluidly coupled through the pneumatic source conduit 424 to the actuation valve 422, and that the pneumatic source 426 be configured to provide actuation fluid 452 to the actuation valve 422. In certain examples, the actuation fluid 452 may include (e.g., consist of or consist essentially of) clean-dry air. In accordance with certain examples, the actuation fluid 452 may include (e.g., consist of or consist essentially of) an inert fluid, such as argon or high purity nitrogen.

The actuation valve 422 yokes the shutoff valve 402 and the inert fluid supply valve 410 to the pyrophoric material detector 114 and in this respect may include a sleeve body 454 and spool member 456. The sleeve body 454 couples the pneumatic source conduit 424 to the slow-close pneumatic actuation conduit 414 and the slow-open pneumatic actuation conduit 416. The spool member 456 is slidably received within the sleeve body 454 and is movable therein between a first position 458, wherein the sleeve body 454 fluidly couples the pneumatic source 426 to the slow-open pneumatic actuation conduit 416, and a second position 460 (shown FIG. 11), wherein the sleeve body 454 fluidly couples the pneumatic source conduit 424 to the slow-close pneumatic actuation conduit 414.

As will be appreciated by those of skill in the art in view of the present disclosure, fluid coupling of pneumatic source conduit 424 causes the pneumatic source 426 to provide the actuation fluid 452 to the inert fluid supply valve 410, the inert fluid supply valve 410 thereby fluidly separating the inert fluid source 14 from the supply conduit 106 and the shutoff valve 402 fluidly coupling the supply conduit 106 to the source conduit 102. As will also be appreciated by those of skill in the art in view of the present disclosure, fluid coupling of the pneumatic source conduit 424 to the slow-close pneumatic actuation conduit 414 causes the pneumatic source 426 to provide the actuation fluid 452 to the shutoff valve 402, the shutoff valve 402 thereby fluidly separating the supply conduit 106 from the source conduit 102 and the inert fluid supply valve 410 fluidly coupling the inert fluid source 14 to the supply conduit 106. It is contemplated movement of the spool member 456 be accomplished by operation of a spool actuator 462, which may be connected to the actuation valve 422 and configured to move the spool member 456 between the first position 458 and the second position 460 responsive to receipt of the slow-close actuation signal 130 from the controller 112. In certain examples, the spool actuator 462 may include a solenoid 464 operatively connected to the spool member 456 and configured to move the spool member 456 between the first position 458 and the second position 460.

The slow-close RFO 418 is arranged along the slow-close pneumatic actuation conduit 414 to throttle flow of the actuation fluid 452 as the fluid traverses the slow-close pneumatic actuation conduit 414. It is contemplated that the slow-close RFO 418 be sized to cooperate with the slow-close pneumatic chamber 428 and the slow-close diaphragm member 430 to throttle flow of the actuation fluid 452 into the slow-close pneumatic chamber 428 such that the shutoff valve 402 closes, responsive to receipt of the slow-close actuation signal 130, according to the slow-close interval 126 (shown in FIG. 4). In certain examples, the slow-close RFO 418 may be sized to close the shutoff valve 402 according to the closing function 150 (shown in FIG. 4). As will be appreciated by those of skill in the art in view of the present disclosure, closure of the shutoff valve 402 during the slow-close interval 126 limits shock communicated to the metastable mass 42 (shown in FIG. 1) associated with pneumatic closing of the shutoff valve 402, limiting (or eliminating) risk of rapid deflagration or detonation of the metastable mass 42 responsive to closing of the shutoff valve 402.

The slow-open RFO 420 is arranged along the slow-open pneumatic actuation conduit 416 to throttle flow of the actuation fluid 452 as the fluid exits the slow-open pneumatic chamber 438, for example, as fluid exits the slow-open pneumatic chamber 438 responsive to connection of the slow-open pneumatic chamber 438 to vent upon movement of the spool member 456 to the second position 460 (shown in FIG. 11). It is contemplated that the slow-open RFO 420 ne matched to the slow-open RFO 420 such that the slow-open diaphragm member 440 moves to the second position 446 (shown in FIG. 11) coincident with movement of the slow-close diaphragm member 430 to the second position 436 (shown in FIG. 11), opening of the inert fluid supply valve 410 thereby being coincident with closing of the shutoff valve 402. In certain examples, opening of the inert fluid supply valve 410 may be during the slow-open interval 222 (shown in FIG. 7). In accordance with examples, opening of the inert fluid supply valve 410 may be according to the opening function 232 (shown in FIG. 7). As will be appreciated by those of skill in the art in view of the present disclosure, opening of the inert fluid supply valve 410 coincident with closing of the shutoff valve 402 may offset (or eliminate) pressure change within the supply conduit 106, further limiting or eliminating entirely risk of rapid deflagration or detonation of the metastable mass 42 responsive to closing of the shutoff valve 402.

As shown in FIG. 10, when the metastable mass 42 (shown in FIG. 1) is not present the supply conduit 106 remains fluidly coupled to the source conduit 102 by the shutoff valve 402. Fluid coupling of the supply conduit 106 to the source conduit 102 causes shutoff valve 402 to flow the pyrophoric material 30 provided by the precursor source 12 (shown in FIG. 1) to the process chamber 24 (shown in FIG. 1) through the metering valve 20. The process chamber 24 in turn flows the pyrophoric material across the substrate 2 (shown in FIG. 1) under conditions selected to the cause the material layer 4 (shown in FIG. 1) to deposit onto the substrate 2, residual pyrophoric material and/or reaction products 38 (shown in FIG. 1) issued by the process chamber 24 flowing to the exhaust source 28 (shown in FIG. 1) and therefrom to the external environment 40 (shown in FIG. 1).

As shown in FIG. 11, when the metastable mass 42 is present, flow of the pyrophoric material 30 is shutoff progressively during the slow-close interval 126 (shown in FIG. 4) to limit (or remove entirely) risk that closing of shutoff valve 402 cause the metastable mass 42 to deflagrate or detonate. In this respect it is contemplated that the pyrophoric material detector 114 detect the metastable mass 42, such in the unlikely event that a fluid-conveying structure develops a leak or is breached during operation, the pyrophoric material detector 114 providing the metastable mass indication signal 142 to the controller 112. Responsive to receipt of the metastable mass indication signal 142, the controller 112 provides a slow-close/slow-open actuation signal 466 to the actuation valve 422. More specifically, the controller 112 provides a slow-close/slow-open actuation signal 466 to the spool actuator 462. Specifically, the controller 112 provides a slow-close/slow-open actuation signal 466 to the solenoid 464. The solenoid 464 in turn moves the spool member 456 from the first position 458 (shown in FIG. 11) to the second position 460. Movement of the spool member 456 switches provision of the actuation fluid 452 from the inert fluid supply valve 410 to the shutoff valve 402.

Switching of the actuation fluid 452 from the inert fluid supply valve 410 to the shutoff valve 402 causes movement of the slow-open diaphragm member 440 from the first position 444 (shown in FIG. 11) to the second position 446, and movement of the slow-close diaphragm member from the first position 434 (shown in FIG. 1) to the second position 436. In certain examples, movement of the slow-close diaphragm member 430 from the first position 434 to the second position 436 may be coincident with movement of the slow-open diaphragm member 440 from the first position 444 to the second position 436. In accordance with certain examples, movement of the slow-close diaphragm member 430 from the first position 434 to the second position 436 may start at the same time, e.g., both start of the start $T_1$ (shown in FIG. 7), and/or end at the same time, e.g., both end at stop $T_2$ (shown in FIG. 7). It is also contemplated that, in accordance with certain examples, the inert fluid supply valve 410 may open during the slow-open interval 222 (shown in FIG. 7) and the shutoff valve 402 close during the slow-close interval 126 (shown in FIG. 7), the slow-close interval 126 coincident with the slow-open interval 222. Advantageously, coincident opening of the inert fluid supply valve 410 and the shutoff valve 402 causes inert fluid 32 is introduced into the flow of pyrophoric material 30 traversing the supply conduit 106 such that increasing partial pressure of the inert fluid 32 offsets decreasing partial pressure of the pyrophoric material 30 during the slow-close interval 126. As will be appreciated by those of skill in the art of the present disclosure, this can offset decrease in flow of the pyrophoric material 30 with flow of the inert fluid 32, further limiting shock communicated to the metastable mass 42 by the closing the of the shutoff valve 402.

With reference to FIGS. 12-14, the flow control method 500 is shown. As shown in FIG. 12, the flow control method 500 includes flowing a pyrophoric material through a shutoff valve of a flow control arrangement, e.g., the pyrophoric material 30 (shown in FIG. 1) through the shutoff valve 104 (shown in FIG. 1) of the flow control arrangement 100 (shown in FIG. 1), as shown with box 510. The method 500 also includes leaking a portion of the pyrophoric fluid from fluid-conveying structure downstream of the shutoff valve to from a metastable mass of pyrophoric fluid outside of the flow control arrangement and fluidly coupled to the flow of the pyrophoric material traversing the shutoff valve, e.g., the metastable mass 42 (shown in FIG. 1), as shown with box 520. The method 500 further includes receiving indication of the metastable mass from a pyrophoric material detector, e.g., the metastable mass indication signal 142 (shown in FIG. 3) from the pyrophoric material detector 114 (shown in FIG. 2), as shown with box 530. The method additionally includes closing the shutoff valve responsive to the indication during a slow-close interval to limit a shock communicated to the metastable mass by the closing of the shutoff valve, e.g., during the slow-close interval 126 (shown in FIG. 4) to limit a shock 44 (shown in FIG. 3), as shown with box 540.

In certain examples, the flow control method 500 may opening an inert fluid supply valve, e.g., the inert fluid supply valve 206 (shown in FIG. 5), coincident with the closing of the shutoff valve to introduce an inert fluid, e.g., the inert fluid 32 (shown in FIG. 1), into the pyrophoric fluid traversing the shutoff valve, as shown with box 550. In accordance with certain examples, the method may further include receiving indication of flame/fire outside of the flow control arrangement, e.g., from the flame/fire detector 22 (shown in FIG. 1), and rapidly closing the shutoff valve responsive to receipt of flame/fire indication during a rapid-close interval, e.g., the rapid-close interval 154 (shown in FIG. 4), as shown with box 560 and box 570.

As shown in FIG. 13, flowing 510 the pyrophoric material through the shutoff valve may include flowing a silicon-containing precursor through the shutoff valve, as shown with box 512. In certain examples, flowing 510 the pyrophoric material through the shutoff valve may include flowing silane ($SiH_4$) through the shutoff valve, as shown with box 514. It is also contemplated that flowing 510 the pyrophoric material through the shutoff valve may include flowing one or more of dichlorosilane ($H_2SiCl_2$), and/or trichlorosilane ($HCl_3Si$) through the shutoff valve, as shown with box 516 and box 518.

Leaking 520 the pyrophoric material may include leaking the pyrophoric material into a ventilated cabinet or gas box, e.g., the ventilated cabinet or gas box 16 (shown in FIG. 1), as shown with box 522. The ventilated cabinet or gas box may be provided with a vent flow, e.g., the flow of the vent fluid 36 (shown in FIG. 1), and the metastable mass may be disposed within a region of static flow within the ventilated cabinet or gas box, as shown with box 524. It is also contemplated that, in accordance with certain examples, leaking 520 the pyrophoric material may include leaking the pyrophoric material from the flow control arrangement at a location outside of the ventilated cabinet or gas box, as shown with box 526.

Closing 540 the shutoff valve may include progressively reducing an effective flow area of the shutoff valve, e.g., the effective flow area 144 (shown in FIG. 4), during a slow-close interval that is between about 1 second and about 10 seconds, as shown with box 542. In certain examples, closing 540 the shutoff valve may include progressively reducing the effective flow area of the shutoff valve that is between about 3 seconds and about 7 seconds, as shown with box 544. In accordance with certain examples, closing 540 the shutoff valve may include progressively reducing the effective flow area of the shutoff valve during a slow-close interval that is between about 3 seconds and about 5 seconds, such as a slow-close interval that is about 4 seconds, as shown with box 546. Closing 540 the shutoff valve may include continuously during the slow-close interval, such as according to a linear closing function, as shown with box 548.

As shown in FIG. 14, opening 550 the inert fluid supply valve may include progressively increasing an effective flow area of the inert fluid supply valve, e.g., the effective flow area 224 (shown in FIG. 7), opening the shutoff valve during a slow-open interval that is between about 1 second and about 10 seconds, as shown with box 552. In certain examples, opening 550 the inert fluid supply valve may include progressively increasing the effective flow area of the inert fluid supply valve during a slow-open interval that is between about 3 seconds and about 7 seconds, as shown with box 554. It is also contemplated that, in accordance with certain examples, opening 550 the inert fluid supply valve may include progressively increasing an effective flow area of the inert fluid supply area during a slow-opening interval that is between about 3 seconds and about 5 seconds, such as a slow-close interval that is about 4 seconds, as shown with box 556. Opening 550 the inert fluid supply valve may be coincident with the closing of the shutoff valve to introduce an inert fluid, e.g., the inert fluid 32 (shown in FIG. 1) into the pyrophoric material traversing the shutoff valve, as shown with box 558.

Fluid systems, such as fluid systems employed to convey material layer precursors to semiconductor processing systems employed to deposit material layers onto substrates, commonly communicate fluids containing pyrophoric materials. In some flow systems, pyrophoric materials may escape from the fluid system and form a metastable mass outside of the fluid system. The metastable mass may, responsive to a shock delivered mechanically (e.g., vibration) or fluidically (via a pressure wave communicated to the metastable mass through the pyrophoric material), deflagrate or detonate, potentially causing injury to personnel and/or damage to equipment in proximity to the metastable mass. For example, in some fluid systems, shock communicated by the closing of an emergency shutoff device may be sufficient to cause rapid deflagration or detonation of the metastable mass.

In examples shown and described herein, flow control arrangements provide shutoff valves with slow-close intervals to limit (or eliminate) likelihood that closing of a shutoff valve triggers deflagration or detonation of metastable masses of pyrophoric material that may be disposed within the ambient environment outside of the flow control arrangement. The slow-close interval may be selected to limit shock conveyed by fluid conveying components of the flow control arrangement associated with closure of the shutoff valve, such as through conduits and/or metering valves. In accordance with certain examples, inert fluid may be introduced into a fluid-conveying component of the flow control arrangement to further limit shock conveyed by the fluid-conveying component and/or metering valve, such as by coincident introduction of the inert fluid downstream of the shutoff valve.

The terminology used herein is for the purpose of describing particular examples only and is not intended to be limiting of the present disclosure. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, element components, and/or groups thereof. The term “about” is intended to include the degree of error associated with measurement of the particular quantity based upon the equipment available at the time of filing the application.

While the present disclosure has been described with reference to an example or examples, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular example disclosed as the best mode contemplated for carrying out this present disclosure, but that the present disclosure will include all examples falling within the scope of the claims.

The invention claimed is:

1. A flow control arrangement, comprising:

a source conduit and a supply conduit;

a shutoff valve connecting the source conduit to the supply conduit;

a slow-close actuator connected to the shutoff valve to close the shutoff valve during a slow-close interval; and a pyrophoric material detector operably connected to the slow-close actuator and configured to close the shutoff valve upon detection of a metastable mass of a pyrophoric material disposed outside of the flow control arrangement, wherein the slow-close interval is sized to limit a shock communicated to the metastable mass by closing of the shutoff valve to prevent deflagration or detonation of the metastable mass; and a controller operably coupling the pyrophoric material detector to the slow-close actuator, the controller responsive to instructions recorded on a memory to:

receive an indication of the metastable mass of the pyrophoric material is disposed outside of the flow control arrangement from the pyrophoric material detector;

close the shutoff valve using the slow-close actuator during a slow-close interval that is between about 1 second and about 10 seconds, wherein an effective flow area of the shutoff valve is progressively reduced during the slow-close interval; and limit a shock communicated to the metastable mass of the pyrophoric material disposed outside the flow control arrangement and fluidly coupled to a fluid including the pyrophoric material traversing the shutoff valve by closing of the shutoff valve.

2. The flow control arrangement of claim 1, further comprising:

a manual valve connected to the source conduit and fluidly coupled therethrough to the shutoff valve; and a precursor source including the pyrophoric material connected to the source conduit and in selective fluid communication with the shutoff valve through the manual valve, wherein the pyrophoric material is a silicon-containing material.

3. The flow control arrangement of claim 1, further comprising:

a metering valve connected to the supply conduit; and a ventilated cabinet or gas box enclosing the metering valve, wherein the pyrophoric material detector is arranged within an interior of the ventilated cabinet or gas box.

4. The flow control arrangement of claim 1, further comprising:

a process chamber connected to the supply conduit and in selective fluid communication with the source conduit through the shutoff valve;

a substrate support arranged within the process chamber and configured to support a substrate during deposition of a material layer on the substrate with the pyrophoric material; and an exhaust source connected the process chamber and fluidly coupled therethrough with the source conduit.

5. The flow control arrangement of claim 1, wherein an effective flow area of the shutoff valve is progressively reduced during the slow-close interval, wherein the slow-close interval is between about 1 second and about 10 seconds, or between about 3 seconds and about 7 seconds, or between about 3 seconds and about 5 seconds.

6. The flow control arrangement of claim 5, wherein the slow-close actuator comprises:

a closure supported within a valve body and movable between a first position and a second position, the valve body fluidly coupling the supply conduit to the source conduit in the first position, the closure fluidly separating the supply conduit from the source conduit in the second position; and a solenoid operatively connected to the closure and configured to move the closure from the first position to the second position during the slow-close interval.

7. The flow control arrangement of claim 5, wherein the slow-close actuator comprises:

a slow-close pneumatic chamber defined within a valve body of the shutoff valve; and a slow-close diaphragm member disposed within the valve body and at least partially bounding the slow-close pneumatic chamber; and wherein the slow-close diaphragm member has a first position and a second position, the valve body fluidly coupling the supply conduit to the source conduit in the first position, the slow-close diaphragm member fluidly separating the supply conduit from the source conduit in the second position.

8. The flow control arrangement of claim 7, further comprising:

a slow-close pneumatic actuation conduit connected to the valve body;

an actuation valve connected to the slow-close pneumatic actuation conduit and fluidly coupled therethrough to the slow-close pneumatic chamber;

a pneumatic source connected to the slow-close pneumatic actuation conduit and in selective fluid communication with the slow-close pneumatic chamber through the actuation valve; and a slow-close restrictive flow orifice arranged along the slow-close pneumatic actuation conduit and configured to throttle an actuation fluid into the slow-close pneumatic chamber to define the slow-close interval.

9. The flow control arrangement of claim 1, further comprising:

an inert fluid conduit connected to the supply conduit;

an inert fluid supply valve connected to the inert fluid conduit and fluidly coupled therethrough to the supply conduit;

an inert fluid source connected to the inert fluid conduit and in selective fluid communication with the supply conduit through the inert fluid supply valve; and a slow-open actuator connected to the inert fluid supply valve to open the inert fluid supply valve during the slow-close interval, wherein the pyrophoric material detector is operably connected to the slow-open actuator.

10. The flow control arrangement of claim 9, wherein the slow-open actuator has a slow-open interval during which an effective flow area of the inert fluid supply valve is progressively increased, wherein the slow-open interval is between about 1 second and about 10 seconds, or between about 3 seconds and about 7 seconds, or between about 3 seconds and about 5 seconds.

11. The flow control arrangement of claim 10, wherein the slow-open interval of the slow-open actuator is substantially equivalent to the slow-close interval of the slow-close actuator.

12. The flow control arrangement of claim 9, further comprising:

a valve member supported within a valve body and movable between a first position and a second position, the valve body fluidly coupling the inert fluid source to the supply conduit in the first position, the valve member fluidly separating the inert fluid source from the supply conduit in the second position; and wherein the slow-open actuator includes a solenoid operatively connected to the valve member and configured to move the valve member from the first position to the second position during a slow-open interval.

13. The flow control arrangement of claim 9, wherein the slow-open actuator comprises:

a slow-open pneumatic actuation conduit connected to the inert fluid supply valve;

an actuation valve connected to the slow-open pneumatic actuation conduit and fluidly coupled therethrough to the inert fluid supply valve;

a pneumatic source fluidly coupled to the actuation valve and in selective fluid communication with the inert fluid supply valve through the actuation valve; and a slow-open restrictive flow orifice arranged along the slow-open pneumatic actuation conduit and configured to throttle an actuation fluid to the inert fluid supply valve to define a slow-open interval of the slow-open actuator.

14. The flow control arrangement of claim 9, further comprising an actuation valve yoking the shutoff valve to the inert fluid supply valve for coincident opening of the shutoff valve and the inert fluid supply valve.

15. The flow control arrangement of claim 1, wherein the instructions further cause the controller to introduce an inert fluid into the supply conduit coincident with closing of the shutoff valve.

16. A semiconductor processing system, comprising:

a precursor source;

a flow control arrangement as recited in claim 1, wherein the precursor source is connected to the source conduit and is in selective fluid communication with the supply conduit through the shutoff valve;

a process chamber with a substrate support connected to the supply conduit and in selective fluid communication with the source conduit through the shutoff valve;

a metering valve arranged along the supply conduit and fluidly coupling the shutoff valve to the process chamber; and a ventilated cabinet or gas box enclosing the metering valve, wherein the pyrophoric material detector is arranged within the ventilated cabinet or gas box.

17. A flow control method, comprising:

at a flow control arrangement including a source conduit and a supply conduit, a shutoff valve connecting the source conduit to the supply conduit, a slow-close actuator connected to the shutoff valve to close the shutoff valve, and a pyrophoric material detector operably connected to the slow-close actuator to close the shutoff valve during a slow-close interval, receiving indication of a metastable mass of a pyrophoric material is disposed outside of the flow control arrangement from the pyrophoric material detector;

closing the shutoff valve using the slow-close actuator during the slow-close interval, wherein the slow-close interval is between about 1 second and about 10 seconds, wherein an effective flow area of the shutoff valve is progressively reduced during the slow-close interval; and limiting shock communicated to the metastable mass of the pyrophoric material associated with the closing of the shutoff valve to prevent rapid deflagration or detonation of the metastable mass of the pyrophoric material according to the slow-close interval.

18. The method of claim 17, further comprising:

opening an inert fluid supply valve using a slow-open actuator during a slow-open interval of between about 1 second and about 10 seconds in concert with the closing of the shutoff valve;

wherein an effective flow area of the inert fluid supply valve is progressively increased during the slow-open interval; and whereby the closing of the shutoff valve limits shock to the metastable mass of the pyrophoric material disposed outside the flow control arrangement and fluidly coupled to a flow containing the pyrophoric material traversing the shutoff valve.

19. The method of claim 18, wherein closing the shutoff valve includes energizing a solenoid or switching flow of actuation fluid from the slow-open actuator to the slow-close actuator.

* * * * *